US006841508B2

(12) United States Patent
Moy et al.

(10) Patent No.: US 6,841,508 B2
(45) Date of Patent: Jan. 11, 2005

(54) CARBIDE AND OXYCARBIDE BASED COMPOSITIONS, RIGID POROUS STRUCTURES INCLUDING THE SAME, METHODS OF MAKING AND USING THE SAME

(75) Inventors: David Moy, Winchester, MA (US); Chunming Niu, Lexington, MA (US); Jun Ma, Quincy, MA (US); James M. Willey, Medford, MA (US)

(73) Assignee: Hyperion Catalysis International, Inc., Cambridge, MA (US)

( * ) Notice: Subject to any disclaimer, the term of this patent is extended or adjusted under 35 U.S.C. 154(b) by 0 days.

(21) Appl. No.: 10/170,269

(22) Filed: Jun. 11, 2002

(65) Prior Publication Data

US 2003/0035769 A1 Feb. 20, 2003

Related U.S. Application Data

(62) Division of application No. 09/481,184, filed on Jan. 1, 2000, now Pat. No. 6,514,897.
(60) Provisional application No. 60/115,735, filed on Jan. 12, 1999.

(51) Int. Cl.$^7$ .......................... B01J 21/18; C01B 35/10; C04B 35/52; B32B 5/24
(52) U.S. Cl. ...................... 502/174; 502/177; 502/180; 502/182; 502/185; 502/439; 502/527.14; 423/277; 423/415.1; 423/439; 423/440; 423/447.1; 501/87; 501/93; 428/40; 428/311.11; 428/312.2; 428/323; 428/367; 428/368
(58) Field of Search ................................ 502/174, 177, 502/180, 182, 185, 439, 527.14; 423/277, 415.1, 439, 440, 447.1–447.6; 501/87, 93; 428/40, 311.11, 312.2, 323, 367, 368

(56) References Cited

U.S. PATENT DOCUMENTS

| 4,271,041 A | 6/1981 | Boudart et al. ............. 252/438 |
| 4,663,230 A | 5/1987 | Tennent et al. ............. 428/367 |
| 4,855,091 A | 8/1989 | Geus ............................ 264/22 |
| 5,139,987 A | 8/1992 | Ledoux et al. .............. 502/177 |
| 5,165,909 A | 11/1992 | Tennent et al. .......... 423/447.3 |

(List continued on next page.)

FOREIGN PATENT DOCUMENTS

| EP | 0396 475 A1 | 11/1989 |
| EP | 0 396 475 A1 | 3/1990 |
| EP | 0 440 569 A2 | 1/1991 |

(List continued on next page.)

OTHER PUBLICATIONS

IJjima, *Nature*, 354, 56, pp. (1991), no month.
Baker and Harris, *Chemistry and Physics of Carbon*, Walker and Thrower ed., vol. 14, p. 83, (1978), no month.

(List continued on next page.)

*Primary Examiner*—Mark L. Bell
*Assistant Examiner*—Patricia L. Hailey
(74) *Attorney, Agent, or Firm*—Barry Evans, Esq.; Kramer Levin Naftalis & Frankel LLP

(57) ABSTRACT

Compositions including oxycarbide-based nanorods and/or carbide-based nanorods and/or carbon nanotubes bearing carbides and oxycarbides and methods of making the same are provided.

Rigid porous structures including oxycarbide-based nanorods and/or carbide based nanorods and/or carbon nanotubes bearing carbides and oxycarbides and methods of making the same are also provided.

The compositions and rigid porous structures of the invention can be used either as catalyst and/or catalyst supports in fluid phase catalytic chemical reactions. Processes for making supported catalyst for selected fluid phase catalytic reactions are also provided. The fluid phase catalytic reactions catalyzed include hydrogenation, hydrodesulfurisation, hydrodenitrogenation, hydrodemetallisation, hydrodeoxigenation, hydrodearomatization, dehydrogenation, hydrogenolysis, isomerization, alkylation, dealkylation and transalkylation.

29 Claims, 5 Drawing Sheets

XRD and SEM of CARBIDE NANORODS

U.S. PATENT DOCUMENTS

| | | | |
|---|---|---|---|
| 5,171,560 A | 12/1992 | Tennent et al. | 423/447.3 |
| 5,196,389 A | 3/1993 | Dubots | 502/178 |
| 5,217,930 A | 6/1993 | Dubots | 501/88 |
| 5,384,027 A | 1/1995 | Sherif | 208/134 |
| 5,391,524 A | 2/1995 | Ledoux et al. | 423/439 |
| 5,451,389 A | 9/1995 | Sherif | 423/439 |
| 5,456,897 A | 10/1995 | Moy et al. | 423/447.3 |
| 5,468,370 A | 11/1995 | Ledoux et al. | 208/134 |
| 5,576,466 A | 11/1996 | Ledoux et al. | 585/735 |
| 5,618,510 A | 4/1997 | Okada et al. | 423/346 |
| 5,676,918 A | 10/1997 | Okada et al. | 423/346 |
| 5,866,434 A | 2/1999 | Massey et al. | 436/526 |
| 5,897,945 A | 4/1999 | Lieber et al. | 428/323 |
| 5,997,832 A * | 12/1999 | Lieber et al. | 423/249 |
| 6,036,774 A * | 3/2000 | Lieber et al. | 117/105 |
| 6,099,965 A * | 8/2000 | Tennent et al. | 428/408 |
| 6,190,634 B1 * | 2/2001 | Lieber et al. | 423/439 |
| 6,419,717 B2 * | 7/2002 | Moy et al. | 44/457 |
| 6,432,866 B1 * | 8/2002 | Tennent et al. | 502/180 |
| 6,514,897 B1 * | 2/2003 | Moy et al. | 502/174 |
| 2001/0001681 A1 * | 5/2001 | Zhang et al. | 427/508 |
| 2002/0121460 A1 * | 9/2002 | Moy et al. | 208/133 |
| 2003/0133865 A1 * | 7/2003 | Smalley et al. | 423/447.1 |

FOREIGN PATENT DOCUMENTS

| | | |
|---|---|---|
| EP | 0 474 570 A1 | 9/1991 |
| EP | 0 511 919 A1 | 4/1992 |
| EP | 0 534 867 A1 | 9/1992 |
| WO | WO 89/07163 | 1/1989 |
| WO | WO 91/05089 | 9/1990 |
| WO | PCT/US/94/10168 | 9/1994 |
| WO | PCT/US 96/09675 | 6/1996 |
| WO | WO 96/41043 | 12/1996 |

OTHER PUBLICATIONS

C. Pham–Huu, et al., "Reactions of n–Heptane and Methylcyclopentane over an Oxygen–Modified Molybdenum Carbide Catalyst. Stude of Coke Formation, Catalyst Deactivation and Regeneration", *Ind. Eng. Chem. Res.* 34, 1107–1113 (1995), no month.

Golodets, G.I. & Ross, J.R.H., "Heterogeneous Catalytic Reactions Involving Molecular Oxygen", *Studies in Surface Science*, 15, Elsevier Press, NYC 1983, no month.

Iglesia, E., et al., "Bifunctional Reactions of Alkanes on Tungsten Carbides Modified by Chemisorbed Oxygen", *Journal of Catalysis*, 131, 523–544 (1991), no month.

Ledoux, M. et al., "Charaterization of a Catalytically Active Molybdenum Oxycarbide", *Mat. Res. Soc. Symp Proc.*, vol. 368, 57–67 (1995), no month.

McCarthy and Bening (Polymer Preprints ACS Div. Of Polymer Chem., 30(1) 420 (1990), no month.

Oberlin, A. and Endo, M., *J. of Crystal Growth*, vol. 32 (1976), pp. 335–349, no month.

Ribeiro, F. et al., "Reactions of Neopentane, Methylcyclohexane, and 3,3–Dimethylpentane on Tungsten Carbides: The Effect of Surface Oxygen on Reaction Pathways", *Journal of Catalysis*, 130, 86–105 (1991), no month.

Ribeiro, F. et a., "Catalytic Reactions of $n$–Alkanes on $\beta$–$W_2C$ and WC: The Effect of Surface Oxygen on Reaction Pathways", *Journal of Catalysis*, 130, 498–513 (1991), no month.

Rodriguez, N., *J. Mater. Research*, vol. 8, p. 3233 (1993), no month.

Ledoux, M., et al., "New Synthesis and Uses of High–Specific–Surface SiC as a Catalytic Support that is Chemically Inert and Has High Thermal Resistance", *Journal of Catalysis*, 114, 176–185 (1988), no month.

Pham–Huu, C., et al., "Reactions of 2– and 3–Methylpentane, Methylcyclopentane, Cyclopentane, and Cyclohexane on Activated $Mo_2C$", *Journal of Catalysis*, 143, 249–261 (1993), no month.

Weaver, *Science*, 165 (1994), no month.

* cited by examiner

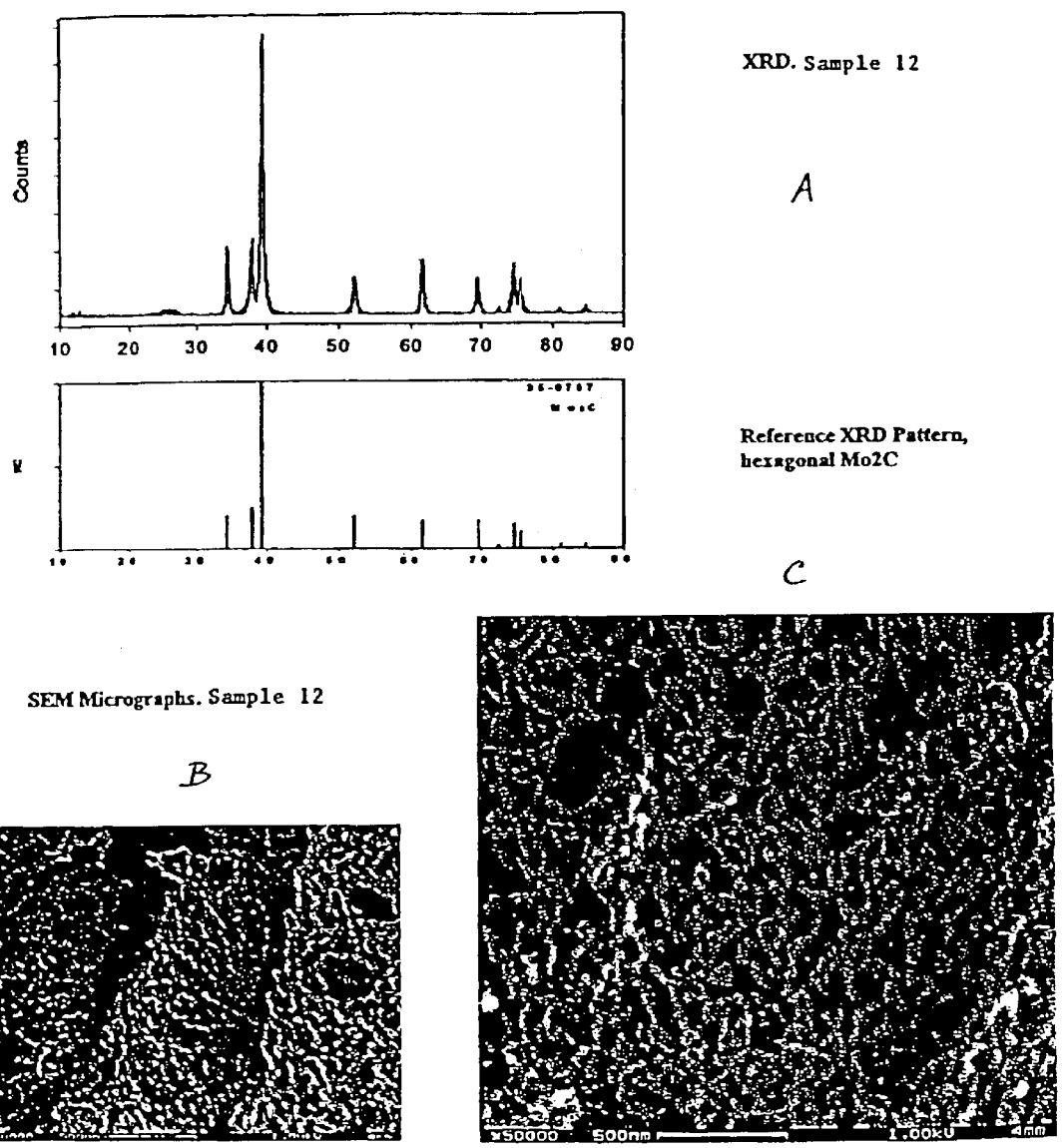
FIGURE 1. XRD and SEM of CARBIDE NANORODS

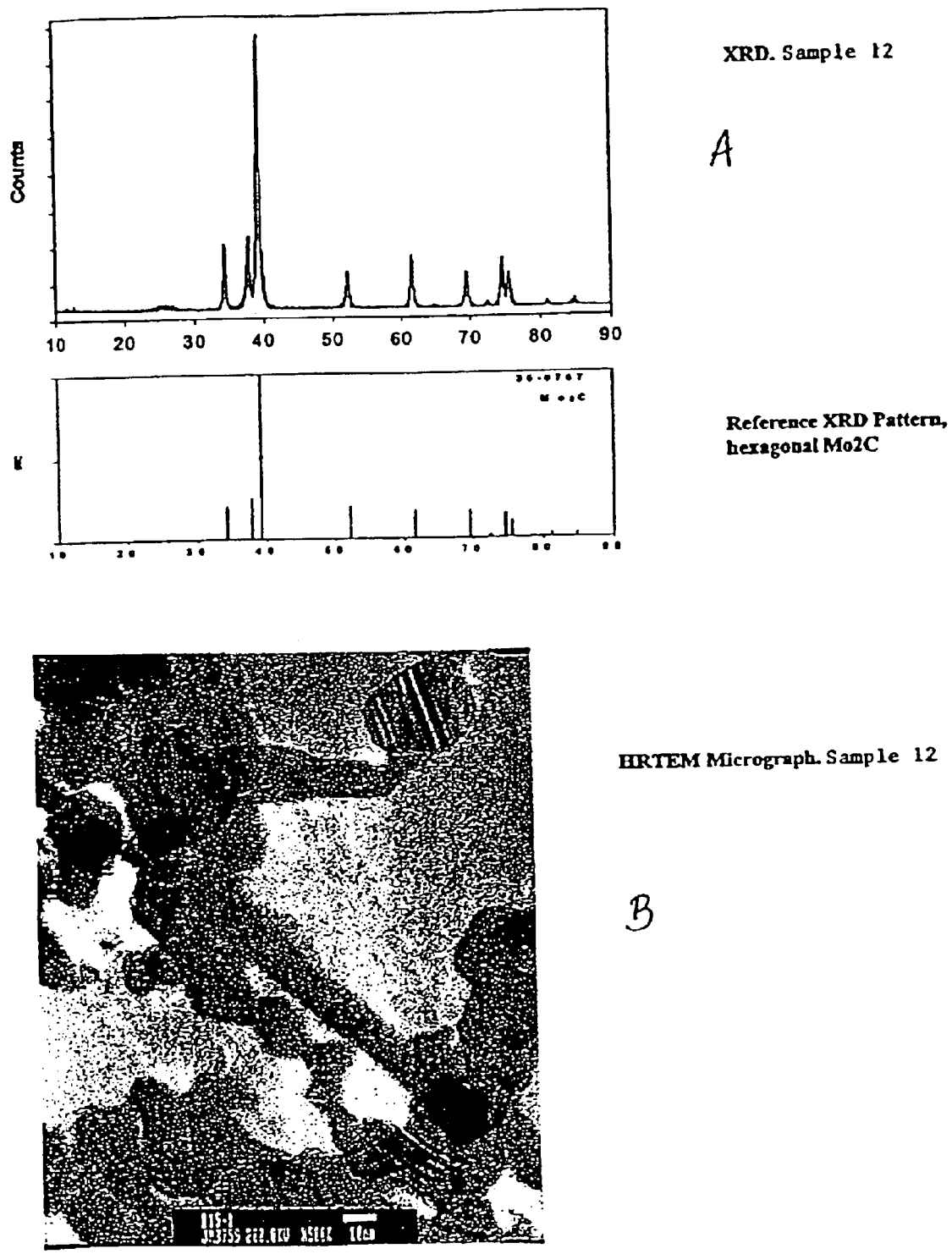
FIGURE 2. XRD and HRTEM of CARBIDE NANORODS
XRD. Sample 12
A
Reference XRD Pattern, hexagonal Mo2C
HRTEM Micrograph. Sample 12
B FIGURE 3. XRD and HRTEM of CARBIDE NANOPARTICLES SUPPORTED ON CARBON NANOTUBES
XRD, Sample 10
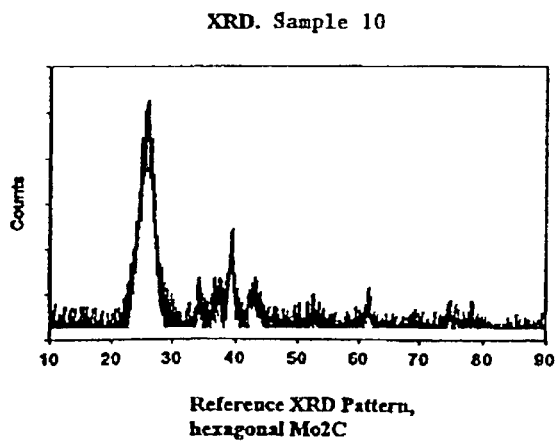
A
Reference XRD Pattern, hexagonal Mo2C
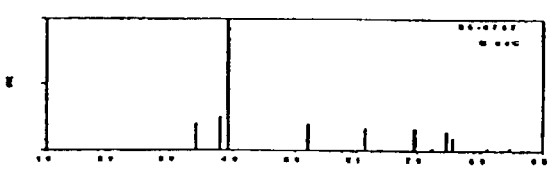
Reference XRD Pattern, cubic Mo2C
Reference XRD Pattern, Graphite
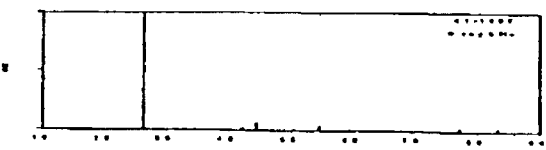
HRTEM Micrograph, Sample 10
B

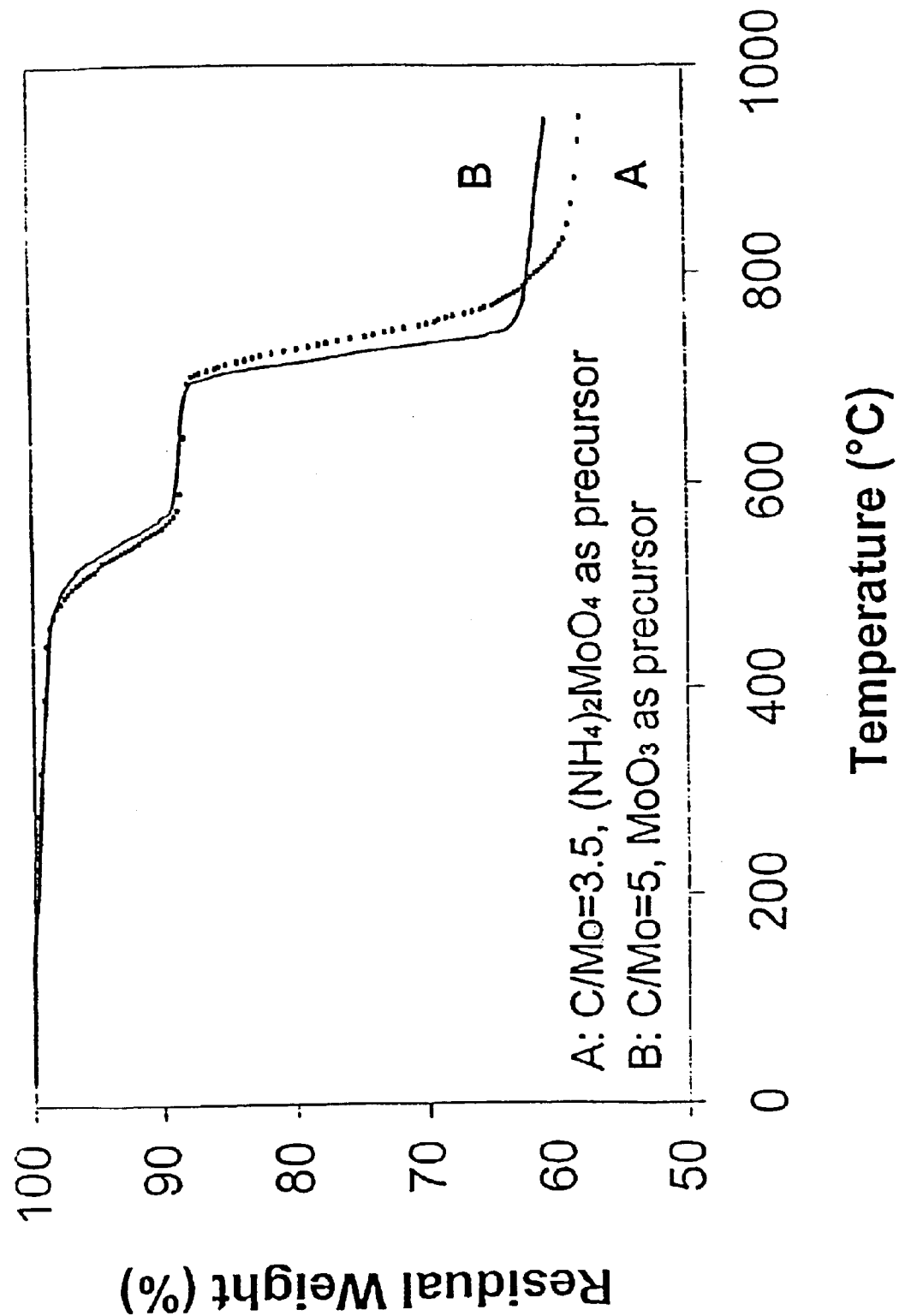
FIGURE 4. Calcination of C:Mo Precursors

CARBIDE AND OXYCARBIDE BASED COMPOSITIONS, RIGID POROUS STRUCTURES INCLUDING THE SAME, METHODS OF MAKING AND USING THE SAME

RELATED APPLICATION

This application is a divisional of U.S. application Ser. No. 09/481,184, filed Jan. 12, 2000 now U.S. Pat. No. 514,887, which claims priority from U.S. Provisional Application No. 60/115,735, filed Jan. 12, 1999, all of which are incorporated herein by reference.

BACKGROUND OF THE INVENTION

1. Field of the Invention

The invention relates to compositions of carbide-based and oxycarbide-based nanorods, carbon nanotubes including carbide and/or oxycarbide compounds, rigid porous structures including these compositions, and methods of making and using the same. More specifically, the invention relates to rigid three dimensional structures comprising carbon nanotubes bearing carbides and oxycarbides, carbide and/or oxycarbide-based nanorods having high surface areas and porosities, low bulk densities, substantially no micropores and increased crush strengths. The invention also relates to using the compositions of carbide-based nanorods, oxycarbide-based nanorods, carbon nanotubes comprising carbide and oxycarbide compounds and the rigid porous structures including these compositions as catalysts and catalyst supports, useful for many types of heterogenous catalytic reactions frequently encountered in petrochemical and refining processes.

2. Description of the Related Art

Heterogeneous catalytic reactions are widely used in chemical processes in the petroleum, petrochemical and chemical industries. Such reactions are commonly performed with the reactant(s) and product(s) in the fluid phase and the catalyst in the solid phase. In heterogeneous catalytic reactions, the reaction occurs at the interface between phases, i.e., the interface between the fluid phase of the reactant(s) and product(s) and the solid phase of the supported catalyst. Hence, the properties of the surface of a heterogeneous supported catalyst are significant factors in the effective use of that catalyst. Specifically, the surface area of the active catalyst, as supported, and the accessibility of that surface area to reactant chemiabsorption and product desorption are important. These factors affect the activity of the catalyst, i.e., the rate of conversion of reactants to products. The chemical purity of the catalyst and the catalyst support have an important effect on the selectivity of the catalyst, i.e., the degree to which the catalyst produces one product from among several products, and the life of the catalyst.

Generally catalytic activity is proportional to catalyst surface area. Therefore, a high specific area is desirable. However, that surface area must be accessible to reactants and products as well as to heat flow. The chemiabsorption of a reactant by a catalyst surface is preceded by the diffusion of that reactant through the internal structure of the catalyst.

Since the active catalyst compounds are often supported on the internal structure of a support, the accessibility of the internal structure of a support material to reactant(s), product (s) and heat flow is important. Porosity and pore size distribution of the support structure are measures of that accessibility. Activated carbons and charcoals used as catalyst supports have surface areas of about 1000 square meters p and porosities of less than one milliliter per gram. However, much of this surface area and porosity, as much as 50%, and often more, is associated with micropores, i.e., pores with pore diameters of 2 nanometers or less. These pores can be inaccessible because of diffusion limitations. They are easily plugged and thereby deactivated. Thus, high porosity material where the pores are mainly in the mesopore (>2 nanometers) or macropore (>50 nanometers) ranges are most desirable.

It is also important that self-supported catalysts and supported catalysts not fracture or attrit during use because such fragments may become entrained in the reaction stream and must then be separated from the reaction mixture. The cost of replacing attritted catalyst, the cost of separating it from the reaction mixture and the risk of contaminating the product are all burdens upon the process. In other processes, e.g. where the solid supported catalyst is filtered from the process stream and recycled to the reaction zone, the fines may plug the filters and disrupt the process. It is also important that a catalyst, at the very least, minimize its contribution to the chemical contamination of reactant(s) and product(s). In the case of a catalyst support, this is even more important since the support is a potential source of contamination both to the catalyst it supports and to the chemical process. Further, some catalysts are particularly sensitive to contamination that can either promote unwanted competing reactions, i.e., affect its selectivity, or render the catalyst ineffective, i.e., "poison" it. Charcoal and commercial graphites or carbons made from petroleum residues usually contain trace amounts of sulfur or nitrogen as well as metals common to biological systems and may be undesirable for that reason.

Since the 1970s carbon nanofibers or nanotubes have been identified as materials of interest for such applications. Carbon nanotubes exist in a variety of forms and have been prepared through the catalytic decomposition of various carbon-containing gases at metal surfaces. Nanofibers such as fibrils, bucky tubes and nanotubes are distinguishable from continuous carbon fibers commercially available as reinforcement materials. In contrast to nanofibers, which have, desirably large, but unavoidably finite aspect ratios, continuous carbon fibers have aspect ratios (L/D) of at least $10^4$ and often $10^6$ or more. The diameter of continuous fibers is also far larger than that of nanofibers, being always>$1.0\mu$ and typically 5 to $7\mu$.

U.S. Pat. No. 5,576,466 to Ledoux et al. discloses a process for isomerizing straight chain hydrocarbons having at least seven carbon atoms using catalysts which include molybdenum compounds whose active surface consists of molybdenum carbide which is partially oxidized to form one or more oxycarbides. Ledoux et al. disclose several ways of obtaining an oxycarbide phase on molybdenum carbide. However, their methods require the formation of molybdenum carbides by reacting gaseous compounds of molybdenum metal with charcoal at temperatures between 900° C. and 1400° C. These are energy intensive processes. Moreover, the resulting molybdenum carbides have many similar drawbacks as other catalysts prepared with charcoal. For example, much of the surface area and porosity of the catalysts is associated with micropores and as such these catalysts are easily plugged and thereby deactivated.

While activated charcoals and other materials have been used as catalysts and catalyst supports, none have heretofore had all of the requisite qualities of high surface area porosity, pore size distribution, resistance to attrition and purity for the conduct of a variety of selected petrochemical and refining processes. For example, as stated above, although these materials have high surface area, much of the surface area is in the form of inaccessible micropores (i.e., diameter <2 nm).

It would therefore be desirable to provide a family of catalysts and catalyst supports that have high accessible surface area, high porosity, resistance to attrition, are substantially free of micropores, are highly active and selective and show no significant deactivation after many hours of operation.

Nanofiber mats, assemblages and aggregates have been previously produced to take advantage of the increased surface area per gram achieved using extremely thin diameter fibers. These structures are typically composed of a plurality of intertwined or intermeshed nanotubes.

OBJECTS OF THE INVENTION

It is an object of the present invention to provide a composition including a multiplicity of oxycarbide nanorods having predominately diameters between 2.0 nm and 100 nm.

It is a further object of the present invention to provide another composition including a multiplicity of carbide nanorods comprising oxycarbides.

It is a further object of the present invention to provide another composition including a multiplicity of carbon nanotubes which have predominantly diameters between 2.0 nm and 100 nm, which nanotubes comprise carbides and optionally also oxycarbides.

It is a further object of the present invention to provide another composition including a multiplicity of carbon nanotubes having a carbide portion and optionally an oxycarbide portion.

It is a further object of the present invention to provide rigid porous structures which comprise compositions including a multiplicity of oxycarbide nanorods or a multiplicity of carbide nanorods with or without oxycarbides.

It is a further object of the present invention to provide compositions of matter which comprise three-dimensional rigid porous structures including oxycarbide nanorods, carbide nanorods, carbide nanorods comprising oxycarbides, or carbon nanotubes comprising a carbide portion and optionally an oxycarbide portion.

It is a further object of the present invention to provide methods for the preparation of and using the rigid porous structures described above.

It is still a further object of the invention to provide improved catalysts, catalyst supports and other compositions of industrial value based on composition including a multiplicity of carbide nanorods, oxycarbide nanorods and/or carbon nanotubes comprising carbides and oxycarbides.

It is still a further object of the invention to provide improved catalysts, catalyst supports and other compositions of industrial value based on three-dimensional rigid carbide and/or oxycarbide porous structures of the invention.

It is an object of the invention to provide improved catalytic systems, improved catalyst supports and supported catalysts for heterogenous catalytic reactions for use in chemical processes in the petroleum, petrochemical and chemical industries.

It is a further object of the invention to provide improved methods for preparing catalytic systems and supported catalysts.

It is another object of the invention to improve the economics and reliability of making and using catalytic systems and supported catalysts.

It is still a further object of the invention to provide improved, substantially pure, rigid carbide catalyst support of high porosity, activity, selectivity, purity and resistance to attrition.

The foregoing and other objects and advantages of the invention will be set forth in or will be apparent from the following description and drawings.

SUMMARY OF THE INVENTION

The present invention which addresses the needs of the prior art provides a composition including nanorods which contain oxycarbides. Another composition provided by the present invention includes carbide-based nanorods which also contain oxycarbides. Another composition provided by the invention relates to carbon nanotubes which bear both carbides and oxycarbides. In one composition the carbides retain the structure of the original aggregates of carbon nanotubes. However, a composition is also provided which includes carbide-based nanorods where the morphology of the aggregates of carbon nanotubes is not retained. The invention also provides a composition of carbides supported on carbon nanotubes where only a portion of the carbon nanotubes have been converted to carbide-based nonorods and/or carbides.

The present invention also provides rigid porous structures including oxycarbide nanorods and/or carbide-based nonorods and/or carbon nanotubes bearing carbides and oxycarbides. Depending on the morphology of the carbon nanotubes used as a source of carbon, the rigid porous structures can have a uniform or nonuniform pore distribution. Extrudates of oxycarbide nanorods and/or carbide-based nanorods and/or carbon nanotubes bearing oxycarbides and/or carbides are also provided. The extrudates of the present invention are glued together to form a rigid porous structure.

The invention also provides for the compositions and rigid porous structures of the invention to be used either as catalysts and/or catalyst supports in fluid phase catalytic chemical reactions.

The present invention also provides methods of making oxycarbide-based nanorods, carbide-based nanorods bearing oxycarbides and carbon-nanotubes bearing carbides and oxycarbides. Methods of making rigid porous structures are also provided. Rigid porous structures of carbide-nonorods an be formed by treating rigid porous structures of carbon nanotubes with a Q-based compound. Depending upon temperature ranges the conversion of the carbon nanotubes to carbide-based nanorods can be complete or partial. The rigid porous structure of carbide nanorods and/or carbon nanotubes can be further treated with an oxidizing agent to form oxycarbide nanorods and/or oxycarbides. The rigid porous structures of the invention can also be prepared from loose or aggregates of carbide-based nanorods and/or oxycarbide-based nanorods by initially forming a suspension in a medium, separating the suspension from the medium, and pyrolyzing the suspension to form rigid porous structures. The present invention also provides a process for making supported catalysts for selected fluid phase catalytic reactions.

Other improvements which the present invention provides over the prior art will be identified as a result of the following description which sets forth the preferred embodiments of the present invention. The description is not in any way intended to limit the scope of the present invention, but rather only to provide a working example of the present preferred embodiments. The scope of the present invention will be pointed out in the appended claims.

BRIEF DESCRIPTION OF THE DRAWINGS

FIG. 1A is an XRD graph of sample 12 as set forth in Table 1. A reference XRD pattern of hexagonal $Mo_2C$ is shown immediately below.

FIGS. 1B and 1C are SEM micrographs of sample 12 as set forth in Table 1.

FIG. 2A is an XRD graph of sample 12 as set forth in Table 1. A reference XRD pattern of hexagonal $Mo_2C$ is also shown immediately below.

FIG. 2B is an HRTEM micrograph of sample 12 as set forth in Table 1.

FIG. 3A is an XRD graph of sample 10 as set forth in Table 1. Reference XRD patterns of hexagonal $Mo_2C$, cubic $Mo_2C$ and graphite are shown immediately below.

FIG. 3B is an HRTEM micrograph of sample 10 as shown in Table C.

FIG. 4 is a thermogravimetric analysis of sample 12 as set forth in Table 1.

DETAILED DESCRIPTION OF THE INVENTION

Definitions

Figure 5A:
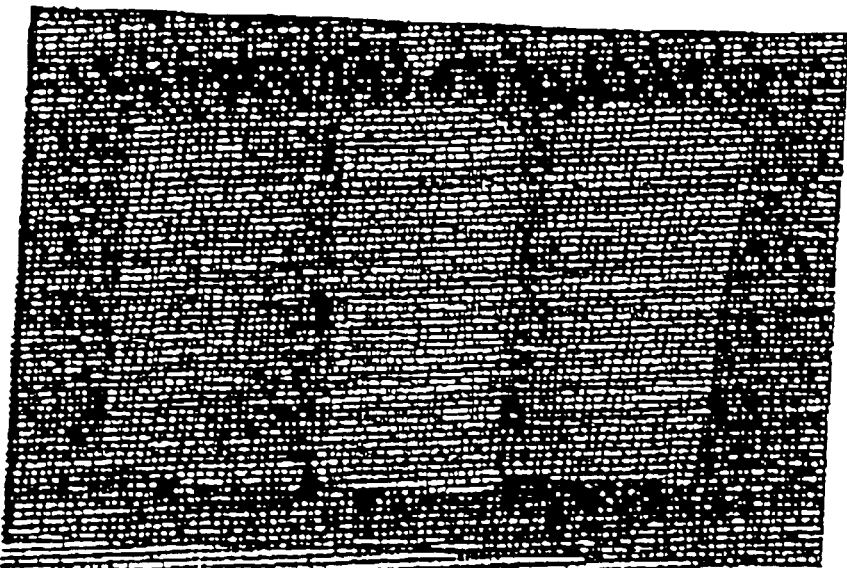
FIG. 5A is an SEM micrograph of SiC extrudates.

The terms "nanotube", "nanofiber" and "fibril" are used interchangeably. Each refers to an elongated hollow structure having a diameter less than 1 micron. The term "nanotube" includes "nanofiber" or "fibril" (which refers, to an elongated solid, (e.g. angular fibers having edges) structures having a cross section of less than 1 micron. The term "nanotube" also includes "bucky tubes" and graphitic nanofibers the graphene planes of which are oriented in herring bone pattern.

"Graphenic" carbon is a form of carbon whose carbon atoms are each linked to three other carbon atoms in an essentially planar layer forming hexagonal fused rings. The layers are platelets only a few rings in diameter or they may be ribbons, many rings long but only a few rings wide.

"Graphenic analogue" refers to a structure which is incorporated in a graphenic surface.

"Graphitic" carbon consists of layers which are essentially parallel to one another and no more than 3.6 angstroms apart The term "nanorod" refers to a rod-like structure having a surface and a substantially solid core with a diameter less than or equal to 100 nm and at least 1.0 nm. The structure has an aspect ratio between 10 and 500 and a length up to 50µ. The diameter of a nanorod is substantially uniform along the entire length of the nanorod. A nanorod is solid without being neither hollow with one or two open ends, nor hollow with two sealed ends.

The term "carbides" refers to well known compounds of composition QC or $Q_2C$. Generally, Q is selected from the group consisting of transition metals (groups 3b, 4b, 5b, 6b, 7b, 8 of periods 4, 5, 6 of the Periodic Table) rare earths (lanthanides) and actinides. More preferably, Q is selected from the group consisting of B, Ti, Nb, Zr, Hf, Si, Al, Mo, V and W. The term also includes crystalline structures characterized by x-ray diffraction (XRD) as QC or $Q_2C$ by themselves and/or in combinations with Q or C, for instance remaining after the sythesis step is substantially complete. Carbides can be detected and characterized by x-ray diffraction (XRD). When, as is contemplated within the scope of this invention, the carbides are prepared by carburization of metal oxides or by oxidation of elemental carbon, a certain amount of "non-stoichiometric" carbide may appear, but the diffraction pattern of the true carbides would still be present. Metal rich non-stoichiometric carbides, such as might be formed from a synthesis wherein the metal is carburized, are simply missing a few of the carbons that the metal matrix can accommodate. Carbon rich non-stoichiometric carbides comprise domains of stoichiometric carbides embedded in the original carbon structure. Once the carbide crystallites are large enough they can be detected by XRD.

Carbides also refers to interstitial carbides as more specifically defined in "Structural Inorganic Chemistry" by A. F. Wells, 4th Edition, Clarendon Press, Oxford 1975 and in "The Chemistry of Transition Metal Carbides and Nitrides", edited by S.T. Oyama, a Blackie Academic & Professional publication, both of which are incorporated herein by reference as if set forth in full.

The term "carbides-based nanorod" refers to a Q-based nanorod predominantly having a diameter greater than 2.0 nm but less than 50 nm, wherein Q is an element capable of forming a carbide, Q being selected from the group consisting of B, Ti, Ta, Nb, Zr, Hf, Si, Al, Mo, V, W, and having an aspect ratio from 5 to 500. When the carbide nanorod has been made by conversion of the carbon of the nanotube to carbide compounds then the conversion has been substantially complete.

The term "oxycarbides-based nanorod" refers to an M-based nanorod having a substantially uniform diameter greater than 1.0 nm but less than or equal to 100 nm, wherein M is any metal capable of forming a oxycarbide such as Ti, Ta, Nb, Zr, Hf, Mo, V, W, B, Si and Al. It has an aspect ratio of 5 to 500.

Oxycarbides, unlike carbides, are inherently non-stoichiometric. The oxycarbides of the present invention have the formula:

$M_nC_{x-y}O_y$ where M selected from the group consisting of transition metals (groups 3b, 4b, 5b, 6b, 7b, 8 of periods 4, 5, 6 of the Periodic Table) rare earths (lanthanides) and actinides, and more preferably Ti, Ta, Hf, Nb, Zr, Mo, V, W, Si, Al, B; n and x are selected to satisfy a known stoichiometry of a carbide of Q, where Q is the same as M; y is less than x and the ratio $[y/(x-y)]$ is at least 0.02 and less than 0.9 and more preferably between 0.05 and 0.50. The term "oxycarbides" also includes but is not limited to products formed by oxidative treatments of carbides present in connection with carbon nanotubes as a source of carbon or in connection with carbide nanorods as a source of carbides. Oxycarbides can also include products formed by carburization of metal oxides. Oxycarbides also comprise mixtures of unreacted carbides and oxides, chemisorbed and physisorbed oxygen. M is selected from the group consisting of Mo, W, V, Nb, Ta, Ti, Zr, Hf, B, Si and Al. More specifically, oxycarbides have a total amount of oxygen sufficient to provide at least 25% of at least one monolayer of absorbed oxygen as determined by temperature programmed desorption (TPD) based on the carbide content of the carbide source. Oxycarbides also refer to compounds of the same name as defined in "The Chemistry of Transition Metal Carbides and Nitrides", edited by S. T. Oyama, a Blackie Academic & Professional publication incorporated herein by referenced as if set forth in full. Examples of oxycarbides include polycrystalline compounds, wherein M is a metal preferably in two valent states. M can be bonded to another metal atom or only to an oxygen or only to a carbon atom. However, M is not bonded to both an oxygen and carbon atoms.

The term "aggregate" refers to a dense, microscopic particulate structure. More specifically, the term "assemblage" refers to structures having relatively or substantially uniform physical properties along at least one dimensional axis and desirably having relatively or substantially uniform physical properties in one or more planes within the assemblage, i.e. they have isotropic physical properties in that plane. The assemblage may comprise uniformly dispersed individual interconnected nanotubes or a mass of connected aggregates of nanotubes. In other embodiments, the entire assemblage is relatively or substantially isotropic with respect to one or more of its physical properties. The physical properties which can be easily measured and by which uniformity or isotropy are determined include resistivity and optical density.

The term "pore" traditionally refers to an opening or depression in the surface of a catalyst or catalyst support. Catalysts and catalyst supports comprising carbon nanotubes lack such traditional pores. Rather, in these materials, the spaces between individual nanotubes behave as pores and the equivalent pore size of nanotube aggregates can be measured by conventional methods (porosimetry) of measuring pore size and pore size distribution. By varying the density and structure of aggregates, one can vary the equivalent pore size and pore size distribution.

The term "micropore" refers to a pore which has a diameter of less than 2 micrometers.

The term "mesopore" refers to pores having a cross section greater than 2 nanometers.

The term "nonuniform pore structure" refers to a pore structure occurring when individual discrete nanotubes are distributed in a substantially nonuniform manner with substantially nonuniform spacings between nanotubes.

The term "uniform pore structure" refers to a pore structure occurring when individual discrete nanotubes or nanofibers form the structure. In these cases, the distribution of individual nanotubes in the particles are substantially uniform with substantially regular spacings between the nanotubes. These spacings (analogous to pores in conventional supports) vary according to the densities of the structures.

The term "bimodal pore structure" refers to a pore structure occurring when aggregate particles of nanotubes and/or nanorods are bonded together. The resulting structure has a two-tiered architecture comprising a macrostructure of nanotube aggregates having macropores among the bundles of nanotube aggregates and a microstructure of intertwined nanotubes having a pore structure within each individual bundle of aggregate particles.

The term "surface area" refers to the total surface area of a substance measurable by the BET technique.

The term "accessible surface area" refers to that surface area not attributed to micropores (i.e., pores having diameters or cross-sections less than 2 nm).

The term "isotropic" means that all measurements of a physical property within a plane or volume of the structure, independent of the direction of the measurement, are of a constant value. It is understood that measurements of such non-solid compositions must be taken on a representative sample of the structure so that the average value of the void spaces is taken into account.

The term "internal structure" refers to the internal structure of an assemblage including the relative orientation of the fibers, the diversity of and overall average of nanotube orientations, the proximity of the nanotubes to one another, the void space or pores created by the interstices and spaces between the fibers and size, shape, number and orientation of the flow channels or paths formed by the connection of the void spaces and/or pores. According to another embodiment, the structure may also include characteristics relating to the size, spacing and orientation of aggregate particles that form the assemblage. The term "relative orientation" refers to the orientation of an individual nanotube or aggregate with respect to the others (i.e., aligned versus non-aligned). The "diversity of" and "overall average" of nanotube or aggregate orientations refers to the range of nanotube orientations within the structure (alignment and orientation with respect to the external surface of the structure).

The term "physical property" means an inherent, measurable property of the porous structure, e.g., surface area, resistivity, fluid flow characteristics, density, porosity, etc.

The term "relatively" means that ninety-five percent of the values of the physical property when measured along an axis of, or within a plane of or within a volume of the structure, as the case may be, will be within plus or minus 20 percent of a mean value.

The term "substantially" means that ninety-five percent of the values of the physical property when measured along an axis of, or within a plane of or within a volume of the structure, as the case may be, will be within plus or minus ten percent of a mean value.

The terms "substantially isotropic" or "relatively isotropic" correspond to the ranges of variability in the values of physical properties set forth above.

The term "predominantly" has the same meaning as the term "substantially".

Carbon Nanotubes

The term nanotubes refers to various carbon tubes or fibers having very small diameters including fibrils, whiskers, buckytubes, etc. Such structures provide significant surface area when incorporated into a structure because of their size and shape. Moreover, such nanotubes can be made with high purity and uniformity.

Preferably, the nanotube used in the present invention have a diameter less than 1 micron, preferably less than about 0.5 micron, and even more preferably less than 0.1 micron and most preferably less than 0.05 micron.

Carbon nanotubes can be made having diameters in the range of 3.5 to 70 nanometers.

The nanotubes, buckytubes, fibrils and whiskers that are referred to in this application are distinguishable from continuous carbon fibers commercially available as reinforcement materials. In contrast to nanofibers, which have desirably large, but unavoidably finite aspect ratios, continuous carbon fibers have aspect ratios (L/D) of at least $10^4$ and often $10^6$ or more. The diameter of continuous fibers is also far larger than that of fibrils, being always >1.0 $\mu$m and typically 5 to 7 $\mu$m.

Continuous carbon fibers are made by the pyrolysis of organic precursor fibers, usually rayon, polyacrylonitrile (PAN) and pitch. Thus, they may include heteroatoms within their structure. The graphitic nature of "as made" continuous carbon fibers varies, but they may be subjected to a subsequent graphitization step. Differences in degree of graphitization, orientation and crystallinity of graphite planes, if they are present, the potential presence of heteroatoms and even the absolute difference in substrate diameter make experience with continuous fibers poor predictors of nanofiber chemistry.

Carbon nanotubes are vermicular carbon deposits having diameters less than $1.0\mu$, preferably less than $0.5\mu$, even more preferably less than $0.2\mu$ and most preferably less than $0.05\mu$. They exist in a variety of forms and have been prepared through the catalytic decomposition of various carbon-containing gases at metal surfaces. Such vermicular carbon deposits have been observed almost since the advent of electron microscopy. A good early survey and reference is found in Baker and Harris, *Chemistry and Physics of Carbon*, Walker and Thrower ed., Vol. 14, 1978, p. 83 and Rodriguez, N., *J. Mater. Research*, Vol. 8, p. 3233 (1993), each of which are hereby incorporated by reference. (see also, Obelin, A. and Endo, M., *J. of Crystal Growth*, Vol. 32 (1976), pp. 335–349, hereby incorporated by reference).

U.S. Pat. No. 4,663,230 to Tennent, hereby incorporated by reference, describes carbon nanotubes or fibrils that are free of a continuous thermal carbon overcoat and have multiple ordered graphitic outer layers that are substantially parallel to the fibril axis. As such they may be characterized as having their c-axes, the axes which are perpendicular to the tangents of the curved layers of graphite, substantially perpendicular to their cylindrical axes. They generally have diameters no greater than $0.1\mu$ and length to diameter ratios of at least 5. Desirably they are substantially free of a continuous thermal carbon overcoat, i.e., pyrolytically deposited carbon resulting from thermal cracking of the gas feed used to prepare them. The Tennent invention provided access to smaller diameter fibrils, typically 35 to 700 Å (0.0035 to $0.070\mu$) and to an ordered, "as grown" graphitic surface. Fibrillar carbons of less perfect structure, but also without a pyrolytic carbon outer layer have also been grown.

U.S. Pat. No. 5,171,560 to Tennent et al., hereby incorporated by reference, describes carbon nanotubes free of thermal overcoat and having graphitic layers substantially parallel to the fibril axes such that the projection of said layers on said fibril axes extends for a distance of at least two fibril diameters. Typically, such fibrils are substantially cylindrical, graphitic nanotubes of substantially constant diameter and comprise cylindrical graphitic sheets whose c-axes are substantially perpendicular to their cylindrical axis. They are substantially free of pyrolytically deposited carbon, have a diameter less than $0.1\mu$ and a length to diameter ratio of greater than 5. These fibrils are of primary interest in the invention.

When the projection of the graphitic layers on the nanotube axis extends for a distance of less than two nanotube diameters, the carbon planes of the graphitic nanotube, in cross section, take on a herring bone appearance. These are termed fishbone fibrils. Geus, U.S. Pat. No. 4,855,091, hereby incorporated by reference, provides a procedure for preparation of fishbone fibrils substantially free of a pyrolytic overcoat. These carbon nanotubes are also useful in the practice of the invention.

According to one embodiment of the invention, oxidized nanofibers are used to form rigid porous assemblages. McCarthy et al., U.S. patent application Ser. No. 351,967 filed May 15, 1989, hereby incorporated by reference, describes processes for oxidizing the surface of carbon nanotubes or fibrils that include contacting the nanotubes with an oxidizing agent that includes sulfuric acid ($H_2SO_4$) and potassium chlorate ($KClO_3$) under reaction conditions (e.g., time, temperature, and pressure) sufficient to oxidize the surface of the fibril. The nanotubes oxidized according to the processes of McCarthy, et al. are non-uniformly oxidized, that is, the carbon atoms are substituted with a mixture of carboxyl, aldehyde, ketone, phenolic and other carbonyl groups.

Nanotubes have also been oxidized nonuniformly by treatment with nitric acid. International Application PCT/US94/10168 discloses the formation of oxidized fibrils containing a mixture of functional groups. Hoogenvaad, M. S., et al. ("Metal Catalysts supported on a Novel Carbon Support", Presented at Sixth International Conference on Scientific Basis for the Preparation of Heterogeneous Catalysts, Brussels, Belgium, September 1994) also found it beneficial in the preparation of nanotube-supported precious metals to first oxidize the nanotube surface with nitric acid. Such pretreatment with acid is a standard step in the preparation of carbon-supported noble metal catalysts, where, given the usual sources of such carbon, it serves as much to clean the surface of undesirable materials as to functionalize it.

In published work, McCarthy and Bening (Polymer Preprints ACS Div. of Polymer Chem. 30 (1)420(1990)) prepared derivatives of oxidized nanotubes or fibrils in order to demonstrate that the surface comprised a variety of oxidized groups. The compounds they prepared, phenylhydrazones, haloaromaticesters, thallous salts, etc., were selected because of their analytical utility, being, for example, brightly colored, or exhibiting some other strong and easily identified and differentiated signal. These compounds were not isolated and are of no practical significance.

The nanotubes may be oxidized using hydrogen peroxide, chlorate, nitric acid and other suitable reagents.

The nanotubes within the structure may be further functionalized as set forth in U.S. patent application Ser. No. 08/352,400, filed Dec. 8, 1995, by Hoch and Moy et al., entitled "Functionalized Fibrils", hereby incorporated by reference.

Carbon nanotubes of a morphology similar to the catalytically grown fibrils or nanotubes described above have been grown in a high temperature carbon arc (Iijima, Nature 354 56 1991, hereby incorporated by reference). It is now generally accepted (Weaver, Science 265 1994, hereby incorporated by reference) that these arc-grown nanofibers have the same morphology as the earlier catalytically grown fibrils of Tennent. Arc grown carbon nanofibers, are also useful in the invention.

Nanotube Aggregates and Assemblages

The "unbonded" precursor nanotubes may be in the form of discrete nanotubes, aggregates of nanotubes or both.

When carbon nanotubes are used, the aggregates, when present, are generally of the bird's nest, combed yarn or open net morphologies. The more "entangled" the aggregates are, the more processing will be required to achieve a suitable composition if a high porosity is desired. This means that the selection of combed yarn or open net aggregates is most preferable for the majority of applications. However, bird's nest aggregates will generally suffice.

As with all nanoparticles, nanotubes aggregate in several stages or degree Catalytically grown nanotubes produced according to U.S. Ser. No. 08/856,657 filed on May 15, 1997 are formed in aggregates substantially all of which will pass through a 700 micron sieve. About 50% by weight of the aggregates pass through a 300 micron sieve. The size of as-made aggregates can, of course, be reduced by various means. but such disaggregation becomes increasingly difficult as the aggregates get smaller.

Nanotubes may also be prepared as aggregates having various morphologies (as determined by scanning electron microscopy) in which they are randomly entangled with each other to form entangled balls of nanotubes resembling bird nests ("BN"); or as aggregates consisting of bundles of straight to slightly bent or kinked carbon nanotubes having substantially the same relative orientation, and having the appearance of combed yarn ("CY") e.g., the longitudinal axis of each nanotube (despite individual bends or kinks) extends in the same direction as that of the surrounding nanotubes in the bundles; or, as, aggregates consisting of straight to slightly bent or kinked nanotubes which are loosely entangled with each other to form an "open net" ("ON") structure. In open net structures the extent of nanotube entanglement is greater than observed in the combed yarn aggregates (in which the individual nanotubes have substantially the same relative orientation) but less than that of bird nest. CY and ON aggregates are more readily dispersed than BN making them useful in composite fabrication where uniform properties throughout the structure are desired.

The morphology of the aggregate is controlled by the choice of catalyst support. Spherical supports grow nanotubes in all directions leading to the formation of bird nest aggregates. Combed yarn and open nest aggregates are prepared using supports having one or more readily cleavable planar surfaces, e.g., an iron or iron-containing metal catalyst particle deposited on a support material having one or more readily cleavable surfaces and a surface area of at least 1 square meters per gram. Moy et al., U.S. application Ser. No. 08/469,430 entitled "Improved Methods and Catalysts for the Manufacture of Carbon Fibrils", filed Jun. 6, 1995, hereby incorporated by reference, describes nanotubes prepared as aggregates having various morphologies (as determined by scanning electron microscopy)

Further details regarding the formation of carbon nanotube or nanofiber aggregates may be found in the disclosure of U.S. Pat. No. 5,165,909 to Tennent; U.S. Pat. No. 5,456,897 to Moy et al.; Snyder et al., U.S. patent application Ser. No. 149,573, filed Jan. 28, 1988, and PCT Application No. US89/00322, filed Jan. 28, 1989 ("Carbon Fibrils") WO 89/07163, and Moy et al., U.S. patent application Ser. No. 413,837 filed Sep. 28, 1989 and PCT Application No. US90/05498, filed Sep. 27, 1990 ("Fibril Aggregates and Method of Making Same") WO 91/05089, and U.S. application Ser. No. 08/479,864 to Mandeville et al., filed Jun. 7, 1995 and U.S. application Ser. No. 08/329,774 by Bening et al., filed Oct. 27, 1984 and U.S. application Ser. No. 08/284,917, filed Aug. 2, 1994 and U.S. application Ser. No. 07/320,564, filed Oct. 11, 1994 by Moy et al., all of which are assigned to the same assignee as the invention here and are hereby incorporated by reference.

Nanotube mats or assemblages have been prepared by dispersing nanofibers in aqueous or organic media and then filtering the nanofibers to form a mat or assemblage. The mats have also been prepared by forming a gel or paste of nanotubes in a fluid, e.g. an organic solvent such as propane and then heating the gel or paste to a temperature above the critical temperature of the medium, removing the supercritical fluid and finally removing the resultant porous mat or plug from the vessel in which the process has been carried out. See, U.S. patent application Ser. No. 08/428,496 entitled "Three-Dimensional Macroscopic Assemblages of Randomly Oriented Carbon Fibrils and Composites Containing Same" by Tennent et al., hereby incorporated by reference.

Extrudates of Carbon Nanotubes

In a preferred embodiment the carbon rigid porous structures comprise extrudates of carbon nanotubes. Aggregates of carbon nanotubes treated with a gluing agent or binder are extruded by conventional extrusion methods into extrudates which are pyrolyzed or carbonized to form rigid carbon structures having bimodal pore structure. The bundles of carbon nanotubes are substantially intact except that they have been splayed (e.g. by sonication) or partially unravelled to provide a bimodal pore structure. The space between bundles ranges from points of contact to about 1 micron. Within bundles, spaces between carbon nanotubes range from 10 nm to 30 nm. The resulting rigid bimodal porous structure is substantially free of micropores, has surface areas ranging from about 250 $m^2/g$ to about 400 $m^2/g$ and a crush strength of about 20 psi for extrudates of ⅛ inch in diameter. Carbon nanotube extrudates have densities ranging from about 0.5 $g/cm^3$ to about 0.7 $g/cm^3$, which can be controlled by the density of the extrusion paste. The extrudates have liquid absorption volumes from about 0.7 $cm^3/g$.

Gluing or binding agents are used to form the paste of carbon nanotubes required for extrusion processes. Useful gluing or binding agents include without limitations cellulose, carbohydrates, polyethylene, polystyrene, nylon, polyurethane, polyester, polyamides, poly (dimethylsiloxane), phenolic resins and the like.

The extrudates obtained as described above can be further treated with mild oxidizing agents such as hydrogen peroxide without affecting the integrity of the rigid porous carbon structures. Subsequently, the rigid porous structures can be impregnated with catalytic particles by ion exchange, generally a preferred method for deposition of small size particles. Alternatively, the rigid porous carbon structure can also be impregnated with catalysts by incipient wetness, or physical or chemical adsorption.

Nanorods

The term nanorods refers to rod-like structures having a substantially solid core, a surface and a diameter greater than 1.0 nm but less than 100 nm. The structure has an aspect ratio between 5 and 500 and a length between 2 nm and 50$\mu$ and preferably between 100 nm and 20$\mu$. The disclosed nanorods are substantially solid, being neither hollow with one or two open ends, nor hollow with two sealed ends.

Carbide Nanorods

Carbide-based nanorods can be prepared by using carbon nanotubes as a source of carbon. For example, D. Moy and C. M. Niu have prepared carbide nanorods or nanofibrils as disclosed in U.S. application Ser. No. 08/414,369 incorporated herein by reference as if set forth in full. They reacted Q-based gas with carbon nanofibrils or nanotubes to form, in situ, solid Q-based carbide nanofibrils or nanorods at temperatures substantially less than 1700° C. and preferably in the range of about 1000° C. to about 1400° C., and more preferably at approximately 1200° C. Q-based gases were volatile compounds capable of forming carbides. Generally, Q is selected from the group consisting of transition metals (groups 3b, 4b, 5b, 6b, 7b, 8 of periods 4, 5, 6) rare earths (lanthanides) and actinides. Preferably, Q was selected from the group consisting of B, Ti, Ta, Nb, Zr, Hf, Si, Al, Mo, V and W.

We call this conversion pseudotopotactic because, even though the dimensions and crystalline orientations of the starting material and product differ, the cylindrical geometry of the starting nanotube is retained in the final nanorod and the nanorods remain separate and predominately unfused to each other. The diameters of the resulting nanorods were about double that of the starting carbon nanofibrils or nanotubes (1 nm–100 nm).

Carbide nanorods have also been prepared by reacting carbon nanotubes with volatile metal or non-metal oxide species at temperatures between 500° C. and 2500° C. wherein the carbon nanotube is believed to act as a template, spatially confining the reaction to the nanotube in accordance with methods described in PCT/US 96/09675 by C. M. Lieber, incorporated herein by reference. Carbide nanorods formed by methods wherein the carbon nanotube serves as a template are also useful in the present invention.

Because of the ease with which they can penetrate fibril aggregates and rigid porous structures, volatile Q compounds are usually preferred. Volatile Q precursors are compounds having a vapor pressure of at least 20 torr at reaction temperature. Reaction with the volatile Q compound may or may not take place through a non-volatile intermediate.

Other methods of preparing carbide nanorods include reductive carburization in which the carbon nanotubes are reacted with Q-based volatile metal oxides followed by passing a flow of gaseous $CH_4/H_2$ mixture at temperatures between 250° C. and 700° C. In addition to Q-based metal oxides, volatile Q-based compounds useful in preparation of Q-based carbide nanorods include carbonyls and chlorides such as, for example, $Mo(CO)_6$, Mo(V) chloride or W(VI)O chloride.

In a preferred method of making useful carbide nanorods for the present invention, vapors of a volatile Q-based compound are passed over a bed of extrudates of carbon nanotubes in a quartz tube at temperatures from about 700° C. to about 1000° C. By controlling the concentration of the Q-based compound, the crystallization of the carbides is limited to the space of the nanotube.

In all the methods of providing carbide-based nanorods discussed above, the extent of conversion of the carbon in carbon nanotubes to carbide nanorods can be controlled by adjusting the concentration of the Q-based compound, the temperature at which the reaction occurs and the duration of the exposure of carbon nanotubes to the volatile Q-based compound. The extent of conversion of the carbon from the carbon nanotubes is between 40% and 100% and preferably around 95%. The resulting carbide nanorods have an excellent purity level in the carbide content, vastly increased surface area and improved mechanical strength. The surface area of the carbide nanorods is from 1 to 400 and preferably 10 to 300 $m^2/g$.

Applications for compositions based on carbide nanorods include catalysts and catalyst support. For example, compositions including carbide nanorods based on molybdenum carbide, tungsten carbide, vanadium carbide, tantalum carbide and niobium carbide are useful as catalysts in fluid phase catalytic chemical reactions selected from the group consisting of hydrogenation, hydrodesulfirisation, hydrodenitrogenation, hydrodemetallisation, hydrodeoxygenation, hydrodearomatization, dehydrogenation, hydrogenolysis, isomerization, alkyation, dealkyation and transalkylation.

Similarly, silicon carbide and aluminum carbide-based nanorods are especially useful as catalyst supports for conventional catalysts such as platinum and palladium, as well as for other Q-based carbides such as molybdenum carbide, tungsten carbide, vanadium carbide and the like.

Oxycarbide Nanorods

Oxycarbide-based nanorods can be prepared from carbide nanorods. The carbide nanorods are subjected to oxidative treatments known in the art. For example, oxidative treatments are disclosed in U.S. Pat. No. 5,576,466 to Ledoux, et al.; M. Ledoux, et al. European Pat. Appln. No. 0396 475 A1, 1989; C. Pham-Huu, et al., Ind. Eng. Chem. Res. 34, 1107–1113, 1995; E. Iglesia, et al., Journal of Catalysis, 131, 523–544, 1991, incorporated herein by reference as if set forth in full. The foregoing oxidative treatments are applicable to the formation of oxycarbide nanorods as well as to the formation of nanotubes and/or nanorods comprising an oxycarbide portion wherein the conversion of the carbide source is incomplete.

Oxycarbide compounds present in an oxycarbide nanorod, and also present when the conversion of the carbide source is incomplete, include oxycarbides having a total amount of oxygen sufficient to provide at least 25% of at least one monolayer of absorbed oxygen as determined by temperature programmed desorption (TPD) based on the carbide content of the carbide source. For example, by subjecting carbide nanorods to a current of oxidizing gas at temperatures of between 30° C. to 500° C. oxycarbide nanorods are produced. Useful oxidizing gases include but are not limited to air, oxygen, carbon dioxide, $N_2O$, water vapor and mixtures thereof. These gases may be pure or diluted with nitrogen and/or argon.

Compositions comprising oxycarbide nanorods are useful as catalysts in many petrochemical and refining processes including hydrogenation, hydrodesulfurisation, hydrodenitrogenation, hydrodemetallisation, hydrodeoxygenation, hydrodearomatization, dehydrogenation, hydrogenolysis, isomerization, alkylation, dealkylation and transalkylation.

Supported Carbides and Oxycarbides

According to another embodiment of the present invention, by adjusting the process parameters, for example, the temperature, the concentration of, and the length of exposure to the Q-based volatile compound, it is possible to limit the rate of conversion of the carbon in the carbon nanotube. Thus, it is possible to provide carbon nanotubes having a carbide portion where the location of the carbide portion can be engineered as desired. For example, the carbide portion of the carbon nanotube can be located entirely on the surface of the carbon nanotube such that only parts of the surface comprise nanocarbide compounds. It is possible to have the entire surface of the carbon nanotube coated with carbides while the core of the carbon nanotube remains substantially carbon. Moreover, it is possible to control the surface coverage of carbon nanotubes with carbide compounds from 1% to 99% of the entire surface area. An embodiment wherein the carbon nanotube comprises carbide covering less than 50% of the surface of the carbon nanotube is preferred. Of course, at low percentages large areas of the carbon nanotube surface remain uncovered. Nevertheless, as long as the carbide portion of the carbon nanotube is retained at the surface, the morphology of the carbon nanotube remains substantially the same.

Similarly, by carefully controlling the process parameters it is possible to turn the carbide portion of the nanotube into a carbide nanorod thereby obtaining a nanotube-nanorod hybrid structure. The carbide portion can be located anywhere on the carbon nanotube Partial conversion of carbon to carbide compounds preferably varies from about 20% to about 85% by weight. When the content of carbide compounds in the carbon nanotube exceeds 85% by weight, then the carbon nanotubes have been substantially converted to carbide nanorods. Once in possession of the teachings herein, one of ordinary skill in the art can determine as a routine matter and without the need for further invention or undue experimentation how to control the rate of conversion of carbon nanotubes to carbide nanorods in order to convert the carbon in the carbon nanotubes incompletely.

The embodiment of the invention where the carbon nanotubes contain a carbide portion also encompasses providing the carbide portion of the carbon nanotube in any manner now known or later developed. For example, in another method of providing carbide compounds on carbon nanotubes or aggregates thereof, the Q-based metal or metal compound, preferably Mo, W or V is placed on the carbon nanotubes or aggregates directly and then pyrolyzed, leaving behind carbon nanotubes coated with carbide compounds.

In yet another method of providing carbide compounds on carbon nanotubes, solutions of Q-based salts, such as, for example, salts of Mo, W or V are dispersed over the carbon nanotubes or aggregates thereof and then pyrolyzed, again forming carbide compounds primarily on the surface of the carbon nanotubes.

An embodiment wherein the core of the carbon nanotube remains carbon and the location of the metallic carbides is limited is quite desirable as a catalytic system. The core of the carbon nanotube acts as a catalyst support or carrier for the metallic carbide catalyst.

In yet another embodiment of the invention, it is possible to transform the core of the carbon nanotubes into one metal carbide preferably silicon carbide or aluminum carbide at temperatures between 1100° C. and 1400° C. Thereafter, by bringing the silicon carbide nanorod in contact with the volatile compound of another metal, for example, MoO, a mixed carbide nanorod is provided which has a silicon carbide (preferably β SiC), core and another Q-based carbide portion. When MoO is used for example, the SiC nanorod can have a MoC portion that could be an outer layer or a MoC-based nanorod. Thus, the resulting nanorod is a mixed carbide-based nanorod wherein part of the nanorod is SiC-based and another portion is MoC-based. There is likewise an advantageous presence of molybdenum silicide. The mixed carbide nanotube or nanorods as discussed above are particularly suitable as catalyst carriers or directly as catalysts in high temperature chemical reactions, particularly in the petrochemical field.

In yet another embodiment of the improvement discussed above, it is possible to subject the nanotube having a carbide portion to oxidative treatments such that the carbide portion of the nanotube further comprises an oxycarbide portion. The oxycarbide portion comprises oxycarbide compounds located any place on, in and within the carbon nanotube or carbide nanorod.

The oxycarbide compounds can be placed on the nanotube in any way now known or later developed. Similarly, the nanotube having a carbide portion can be exposed to air or subjected to carburization or any other means of converting the carbide portion of the nanotube partially or completely into an oxycarbide nanorod portion. Thus, it is possible to provide a carbon nanotube which is partly still a carbon nanotube, partly a carbide nanorod and partly a oxycarbide nanorod also referred to as a carbon-carbide-oxycarbide nanotube-nanorod hybrid.

Carbide and Oxycarbide Rigid Porous Structures

The invention also relates to rigid porous structures made from carbide nanorods, oxycarbide nanorods, and supported carbide and oxycarbide carbon nanotubes and methods for producing the same The resulting structures may be used in catalysis, chromatography, filtration systems, electrodes, batteries and the like.

The rigid porous structures according to the invention have high accessible surface area. That is, the structures have a high surface area which are substantially free of micropores (i.e., pores having a diameter or cross-section less than 2 nm). The invention relates to increasing the mechanical integrity and/or rigidity of porous structures comprising intertwined carbon nanotubes and/or carbide and/or oxycarbide nanorods. The structures made according to the invention have higher crush strengths than the conventional carbon nanotube or nanorod structures. The present invention provides a method of improving the rigidity of the carbon structures by causing the nanotubes and/or nanorods to form bonds or become glued with other nanotubes and/or nanorods at the nanotube and/or nanorod intersections. The bonding can be induced by chemical modification of the surface of the nanotubes to promote bonding, by adding "gluing" agents and/or by pyrolyzing the nanotubes to cause fusion or bonding at the interconnect points.

The nanotubes or nanorods can be in the form of discrete nanotubes and/or nanorods or aggregate particles of nanotubes and nanorods. The former results in a structure having fairly uniform properties. The latter results in a structure having two-tiered architecture comprising an overall macrostructure comprising aggregate particles of nanotubes and/or nanorods bonded together and a microstructure of intertwined nanotubes and/or nanorods within the individual aggregate particles.

According to one embodiment, individual discrete nanotubes and/or nanorods form the structure. In these cases, the distribution of individual nanotube and/or nanorod strands in the particles are substantially uniform with substantially regular spacing between strands. These spacings (analogous to pores in conventional supports) vary according to the densities of the structures and range roughly from 15 nm in the densest to an average 50–60 nm in the lightest particles (e.g., solid mass formed from open net aggregates). Absent are cavities or spaces that would correspond to micropores (<2 nm) in conventional carbon supports.

According to another embodiment, the distribution of individual nanotubes and/or nanorods is substantially non-uniform with a substantially nonuniform pore structure. Nevertheless, there are no cavities or spaces corresponding to micropores which are frequently present in other catalysts and catalyst supports.

These rigid porous materials are superior to currently available high surface area materials for use in fixed-bed reactors, for example. The ruggedness of the structures, the porosity (both pore volume and pore structure), and the purity of the carbide nanorods and/or oxycarbide nanorods are significantly improved. Combining these properties with relatively high surface areas provides a unique material with useful characteristics.

One embodiment of the invention relates to a rigid porous structure comprising carbide nanorods having an accessible surface area greater than about 10 $m^2$/gm and preferably greater than 50 $m^2$/gm, being substantially free of micropores and having a crush strength greater than about 1 lb. The structure preferably has a density greater than 0.5 $g/cm^3$ and a porosity greater than 0.8 $cm^3$/g. Preferably, the structure comprises intertwined, interconnected carbide nanorods and is substantially free of micropores.

According to one embodiment, the rigid porous structure includes carbide nanorods comprising oxycarbide compounds, has an accessible surface area greater than about 10 $m^2$/gm, and preferably greater than 50 $m^2$/gm, is substantially free of micropores, has a crush strength greater than about 1 lb and a density greater than 0.5 g/cm$^3$ and a porosity greater than 0.8 cm$^3$/g.

According to another embodiment the rigid porous structure includes oxycarbide nanorods having an accessible surface area greater than about 10 m$^2$/gm, and preferably greater than 50 m$^2$/gm, being substantially free of micropores, having a crush strength greater than about 1 lb, a density greater than 0.5g/cm$^3$ and a porosity greater than 0.8 cm$^3$/g.

According to yet another embodiment, the rigid porous structure includes carbon nanotubes comprising a carbide portion. The location of the carbide portion can be on the surface of the carbon nanotube or any place on, in or within the carbon nanotube or the carbide portion can be converted into a carbide nanorod forming a carbon nanotube-carbide nanorod hybrid. Nevertheless, the catalytic effectiveness of these rigid porous structures is not affected by the carbide portion on the resulting composites. This rigid porous structures has an accessible surface area greater than about 10 m$^2$/gm and preferably than 50 m$^2$/gm, is substantially free of micropores, has a crush strength greater than about 1 lb, a density greater than 0.5g/cm$^3$ and a porosity greater than 0.8 cm$^3$/g.

In another related embodiment the rigid porous structure includes carbon nanotubes having a carbide portion and also an oxycarbide portion. The location of the oxycarbide portion can be on the surface of the carbide portion or any place on, in or within the carbide portion.

Under certain conditions of oxidative treatment it is possible to convert a portion of the carbide nanorod part of the carbon-carbide nanotube-nanorod hybrid into an oxycarbide. The rigid porous structure incorporating carbon-carbide-oxycarbide nanotube-nanorod hybrids has an accessible surface area greater than about 10 m$^2$/gm, is substantially free of micropores, has a crush strength greater than about 1 lb, a density greater than 0.5g/cm$^3$ and a porosity greater than 0.8 cm$^3$/g.

According to one embodiment, the rigid porous structures described above comprise nanotubes and/or nanorods which are uniformly and evenly distributed throughout said rigid structures. That is, each structure is a rigid and uniform assemblage of nanotubes and/or nanorods. The structures comprise substantially uniform pathways and spacings between said nanotubes and/or nanorods. The pathways or spacings are uniform in that each has substantially the same cross-section and are substantially evenly spaced. Preferably, the average distance between nanotubes and/or nanorods is less than about 0.03 microns and greater than about 0.005 microns. The average distance may vary depending on the density of the structure.

According to another embodiment, the rigid porous structures described above comprise nanotubes and/or nanorods which are nonuniformly and unevenly distributed throughout said rigid structures. The rigid structures comprise substantially nonuniform pathways and spacings between said nanorods. The pathways and spacings have nonuniform cross-section and are substantially unevenly spaced. The average distance between nanotubes and/or nanorods varies between 0.0005 microns to 0.03 microns. The average distances between nanotubes and/or nanorods may vary depending on the density of the structure.

According to another embodiment, the rigid porous structure comprises nanotubes and/or nanorods in the form of nanotube and/or nanorod aggregate particles interconnected to form said rigid structures. These rigid structures comprise larger aggregate spacings between the interconnected aggregate particles and smaller nanotube and/or nanorod spacings between the individual nanotubes and/or nanorods within the aggregate particles. Preferably, the average largest distance between said individual aggregates is less than about 0.1 microns and greater than about 0.001 microns. The aggregate particles may include, for example, particles of randomly entangled balls of nanotubes and/or nanorods resembling bird nests and/or bundles of nanotubes and/or nanorods whose central axes are generally aligned parallel to each other.

Another aspect of the invention relates to the ability to provide rigid porous particulates or pellets of a specified size dimension. For example, porous particulates or pellets of a size suitable for use in a fluidized packed bed. The method involves preparing a plurality of nanotubes and/or nanorods aggregates, fusing or gluing the aggregates or nanotubes and/or nanorods at their intersections to form a large rigid bulk solid mass and sizing the solid mass down into pieces of rigid porous high surface area particulates having a size suitable for the desired use, for example, to a particle size suitable for forming a packed bed.

General Methods of Making Rigid Porous Structures

The above-described rigid porous structures are formed by causing the nanotubes and/or nanorods to form bonds or become glued with other nanofibers at the fiber intersections. The bonding can be induced by chemical modification of the surface of the nanofibers to promote bonding, by adding "gluing" agents and/or by pyrolyzing the nanofibers to cause fusion or bonding at the interconnect points. U.S. patent application Ser. No. 08/857,383 filed May 15, 1997, incorporated herein by reference, describes processes for forming rigid porous structures from carbon nanofibers or nanotubes. These processes are equally applicable to forming rigid porous structures including discrete unstructured nanotubes or nanotube aggregates comprising carbides and in another embodiment also oxycarbides, wherein the carbon nanotube morphology has been substantially preserved. These methods are also applicable to forming rigid porous structures comprising carbide or oxycarbide nanorods, unstructured or as aggregates. Additionally, these methods are also applicable to forming rigid porous structures comprising hybrids of carbon-carbide nanotube-nanorods and/or carbon-carbide-oxycarbide nanotube-nanorods.

In several other embodiments rigid porous structures comprising carbide nanorods are prepared by contacting a rigid porous carbon structure made of carbon nanotubes with volatile Q-based compounds under conditions sufficient to convert all of the carbon or only part of the carbon of the carbon nanotubes to carbide-based compounds.

The rigid, high porosity structures can be formed from regular nanotubes or nanotube aggregates, either with or without surface modified nanofibers (i.e., surface oxidized nanotubes). Surface oxidized nanotubes can be crosslinked according to methods described in U.S. patent application Ser. No. 08/856,657 filed on May 15, 1997 and U.S. patent application Ser. No. 08/857,383 also filed on May 15, 1997, both incorporated herein by reference, and then carbonized to from a rigid porous carbon structure having a uniform pore structure, substantially free of micropores.

Preferred Methods of Making Carbide Based Rigid Porous Structures

There are many methods of preparing rigid porous structures comprising carbide nanorods. In one embodiment the rigid porous carbon structures prepared as described above are contacted with Q-based compounds under conditions of temperature and pressure sufficient to convert the carbon nanotubes of the rigid porous carbon structure to carbide nanorods. The location of the carbide portion of the carbon nanotubes of the rigid porous carbide structure can be on the surface of the carbon nanotube or any place on, in or within the carbon nanotube, or when the conversion is complete then the entire carbon nanotube is transformed into a substantially solid carbon nanorod. Once in the possession of the teachings herein, one of ordinary skill in the art can determine as a routine matter and without the need for further invention or undue experimentation how to control the rate of conversion of carbon nanotubes present in the rigid porous carbon structure to a rigid porous carbide-based structure comprising carbon nanotubes having a carbide portion which can vary in location on the carbon nanotube and in an amount from about 20% to about 85%, preferably in excess of 85% by weight.

The carbide-based rigid porous structures of the present invention have high accessible surface areas between 10 $m^2/gm$ and 100 $m^2/gm$ and are substantially free of micropores. These structures have increased mechanical integrity and resistance to attrition by comparison to individual carbide-based nanorods. Carbide-based rigid porous structures have a density greater than 0.5 $g/cm^3$ and a porosity greater than 0.8 $cm^3/g$. The structure has at least two dimensions of at least 10 microns and not greater than 2 cm. Depending on the pore structure of the starting rigid porous carbon structure, the porous structure of the carbide-based rigid porous structure can be uniform, nonuniform or bimodal.

When the rigid porous structure is uniform the average distance between said carbide-based nanorods is less than 0.03 microns and greater than 0.005 microns. In another embodiment the rigid porous structure comprises carbide-based nanorods in the form of interconnected aggregate particles wherein the distance between individual aggregates ranges from point of contact to $1\mu$. When the carbide-based nanorod rigid porous structures was formed from rigid porous carbon structures comprising nanotube aggregates, the structure has aggregate spacings between interconnected aggregate particles and carbide nanorod spacings between nanorods within the aggregate particles. As a result the rigid porous structure has a bimodal pore distribution.

One embodiment of the invention relates to rigid porous structures comprising extrudates of aggregate particles of carbide nanorods, wherein the carbide nanorods are glued together with binding agents such as cellulose, carbohydrates, polyethylene, polystyrene, nylon, polyurethane, polyester, polyamides, poly (dimethylsiloxane) and phenolic resins. Without being bound by theory, it is believed that the conversion of a rigid porous carbon structure to a carbide-based rigid porous structure whether completely or partially is accomplished in pseudo-topotactic manner as previously discussed herein above.

Preferred Methods of Making Oxycarbide Based Rigid Porous Structures

There are many methods of preparing rigid porous structures comprising oxycarbide nanorods and/or nanotubes comprising a carbide portion and further an oxycarbide portion. In one embodiment the carbide based rigid porous structures are subjected to oxidative treatments as disclosed in the art and in U.S. Pat. No. 5,576,466 to Ledoux et al. issued Nov. 13, 1996.

In another embodiment rigid porous structure comprising carbon nanotubes having an oxycarbide portion and/or a carbide portion are prepared by subjecting to oxidative treatments disclosed in the art rigid porus carbon structures which have been partially converted to carbide nanorods.

In another embodiment discrete carbide nanorods are subjected to oxidative treatments and then assembled into rigid porous structures according to methods similar to those disclosed in U.S. patent application Ser. No. 08/857,383 filed May 15, 1997 incorporated herein by referenced.

In yet another embodiment discrete carbon nanotubes or aggregate of carbon nanotubes which have been partially converted to carbide nanorods are further subjected to oxidative treatments and then assembled into rigid porous structures according to methods disclosed in U.S. patent application Ser. No. 08/857,383 filed May 15, 1997.

Catalytic Compositions

The carbide and/or oxycarbide nanorods and nanotubes having carbide and/or oxycarbide portions of the invention, have superior specific surface areas as compared to carbide and oxycarbide catalysts previously taught in the art. As a result, they are especially useful in the preparation of self-supported catalysts and as catalyst supports in the preparation of supported catalysts. The self-supported catalysts of the invention include catalytic compositions comprising nanotubes and/or nanorods and rigid porous structures comprising the same. Self-supported catalysts of the invention constitute the active catalyst compound and can be used without any additional physical support to catalyze numerous heterogenous reactions as more specifically described herein. The supported catalyst of the invention comprises a support including a nanofiber and/or nanorod rigid porous structure and a catalytically effective amount of a catalyst supported thereon.

The uniquely high macroporosity of carbon nanotube structures, the result of their macroscopic morphology, greatly facilitates the diffusion of reactants and products and the flow of heat into and out of the self-supported catalysts. This unique porosity results from a random entanglement or intertwining of nanotubes and/or nanorods that generates an unusually high internal void volume comprising mainly macropores in a dynamic, rather than static state. Sustained separability from fluid phase and lower losses of catalyst as fines also improves process performance and economics. Other advantages of the nanotube and/or nanorod structures as self-supported catalysts include high purity, improved catalyst loading capacity and chemical resistance to acids and bases. As self-supported catalysts, carbon nanotube and/or nanorod aggregates provide superior chemical and physical properties in porosity, surface are, separability and purity.

Self-supported catalysts made of nanotubes and/or nanorods have a high internal void volume that ameliorates the plugging problem encountered in various processes. Moreover, the preponderance of large pores obviates the problems often encountered in diffusion or mass transfer limited reactions. The high porosities ensure significantly increased catalyst life.

One embodiment of the invention relates to self-supported catalyst which is a catalytic-composition comprising carbide-based nanorods having a diameter between at least 1.0 nm and less than 100 nm, and preferably between 3.5 nm and 20 nm. The carbide-based nanorods have been prepared from carbon nanotubes which have been substantially converted to carbide nanorods. In the catalytic composition of this embodiment the carbide nanorods retain substantially the structure of the original carbon nanotubes. Thus, the carbide nanotubes can have uniform, nonuniform or bimodal porous structure. These catalytic compositions can be used as catalysts to catalyze reactions such as hydrogenation, hydrodesulfurisation, hydrodenitrogenation, hydrodemetallisation, hydrodeoxygenation, hydrodearomatization, dehydrogenation, hydrogenolysis, isomerization, alkylation, dealkylation and transalkylation.

Catalytic Compositions Supported on Aggregates of Carbide and Oxycarbide Nanorods Depending upon the application the rigid porous structures of the invention can be used as both self-supported catalysts and as catalyst supports. As is true of catalysts comprising regular nanotubes and/or nanorods, catalysts and catalyst supports comprising the rigid porous structures of the invention have unique properties. They are exceptionally mesoporous and macroporous. They are also pure and resistant to attrition, compression and shear and consequently can be separated from a fluid phase reaction medium over a long service life. The increased rigidity of the rigid porous structures of the present invention enables catalysts and catalyst supports comprising the structures to be used in fixed bed catalytic reactions. A packing containing the sized rigid structures can be formed and a fluid or gas passed through the packing without significantly altering the shape and porosity of the packing since the rigid structures are hard and resist compression.

Rigid structures formed from nanorod aggregates, preferably silicon carbide and aluminum carbide-based nanorods are particularly preferred structures for use as catalyst supports.

The combination of properties offered by nanorod structures is unique. No known catalyst supports combine such high porosity, high accessible surface area and attrition resistance. The combination of properties offered by the nanorod structures is advantageous in any catalyst system amenable to the use of a carbide catalyst support. The multiple nanorods that make up a nanorod structure provide a large number of junction points at which catalyst particles can bond to multiple nanorods in the nanorod structures. This provides a catalyst support that more tenaciously holds the supported catalyst. Further, nanorod structures permit high catalyst loadings per unit weight of nanorod. However, catalyst loadings are generally greater than 0.01 weight percent and preferably greater than 0.1, but generally less than 5% weight based on the total weight of the supported catalyst. Usually catalyst loadings greater than 5% by weight are not useful, however catalyst loadings greater than 5% by weight of active catalyst based on the total weight of the supported catalyst are easily within the contemplation of the invention, i.e., loadings in excess of 100 weight percent based on the weight of the support of the invention, owing to the porosity of nanorod structures and other factors discussed herein. Desirable hydrogenation catalysts are the platinum group (ruthenium, osmium, rhodium, iridium, palladium and platinum or a mixture thereof) and, preferably, palladium and platinum or a mixture thereof. Group VII metals including especially iron, nickel and cobalt are also attractive hydrogenation catalysts.

Oxidation (including partial oxidation) catalysts may also be supported on carbide and oxycarbide nanotubes and nanotube structures. Desirable metallic oxidation catalysts include, not only members of the platinum group enumerated above, but also, silver and the group VIII metals. Oxidation catalysts also include metal salts known to the art including salts of vanadium, tellurium, manganese, chromium, copper, molybdenum and mixtures thereof as more specifically described in "Heterogeneous Catalytic Reactions Involving Molecular Oxygen," by Golodets, G. I. & Ross, J. R. H, *Studies in Surface Science*, 15, Elsevier Press, NYC 1983.

Active catalysts include other carbide compounds such as carbides of Ti, Ta, Hf, Nb, Zr, Mo, V and W. These supported carbides are particularly useful for hydrogenation, hydrodesulfurisation, hydrodenitrogenation, hydrodemetallisation, hydrodeoxygenation, hydrodearomatization, dehydrogenation, hydrogenolysis, isomerization, alkylation, dealkylation and transalkylation.

Because of their high purity, carbide nanorod aggregates exhibit high resistance to attack by acids and bases. This characteristic is advantageous since one path to regenerating catalysts is regeneration with an acid or a base. Regeneration processes can be used which employ strong acids or strong bases. This chemical resistance also allows the carbide supports of the invention to be used in very corrosive environments.

The supported catalysts are made by supporting a catalytically effective amount of catalyst on the rigid nanorod structure. The term "on the nanotube and/or nanorod structure" embraces, without limitation, on, in and within the structure and on the nanotubes and/or nanorods thereof. The aforesaid terms may be used interchangeably. The catalyst can be incorporated onto the nanotube and/or nanorod or aggregates before the rigid structure is formed, while the rigid structure is forming (i.e., add to the dispersing medium) or after the rigid structure is formed.

Methods of preparing heterogeneous supported catalysts of the invention include adsorption, incipient wetness impregnation and precipitation. Supported catalysts may be prepared by either incorporating the catalyst onto the aggregate support or by forming it in situ and the catalyst may be either active before it is placed in the aggregate or activated in situ.

The catalyst, such as a coordination complex of a catalytic transition metal, such as palladium, rhodium or platinum, and a ligand, such as a phosphine, can be adsorbed by slurrying the nanorods in a solution of the catalyst or catalyst precursor for an appropriate time for the desired loading.

These and other methods may be used in forming the catalyst supports. A more detailed description of suitable methods for making catalyst supports using nanotube structures is set forth in U.S. application Ser. No. 08/857,383 by Moy et al. entitled "rigid Porous Carbon Structures, Methods of Making, Methods of Using and Products Containing Same" filed May 15, 1997, hereby incorporated by reference.

Preferred Catalytic Compositions and Their Uses

One embodiment of the invention relates to a catalyst comprising a composition including a multiplicity of oxycarbide-based nanorods. Each nanorod has substantially uniform diameters between 3.5 nm and 20 nm. As previously described, the oxycarbide-based nanorods have a substantially solid core, form a substantially polycrystalline solid and the individual nanorods are predominantly unfused.

Another embodiment relates to a catalyst comprising a rigid porous structure including oxycarbide-based nanorods as described above. Each catalytic composition can be used as a catalyst in a fluid phase reaction selected from the group consisting of hydrogenation, hydrodesulfurisation, hydrodenitrogenation, hydrodemetallisation, hydrodeoxygenation, hydrodearomatization, dehydrogenation, hydrogenolysis, isomerization, alkylation, dealkylation and transalkylation.

Another embodiment of the invention relates to a catalyst comprising a composition including a multiplicity of Q-based nanorods, wherein Q is selected from the group consisting of B, Si, Al, Ti, Ta, Nb, Zr, Hf, Mo, V and W. The resulting carbide nanorods can be distributed nonuniformly, uniformly or can be in the form of interconnected aggregate particles.

In a related embodiment, the catalyst comprises a rigid porous structure based on the Q-based nanorods described above which have been formed into extrudates and connected by gluing agents or in any other manner sufficient to form the rigid porous structure. Each catalytic composition discussed immediately above can be used as catalysts in a fluid phase reaction selected from the group consisting of hydrogenation, hydrodesulfurisation, hydrodenitrogenation, hydrodemetallisation, hydrodeoxygenation, hydrodearomatization, dehydrogenation, hydrogenolysis, isomerization, alkylation, dealkylation and transalkylation.

Another embodiment relates to a catalyst comprising a composition including a multiplicity of carbide-based nanorods which further comprise oxycarbide compounds any place on, in or within the nanorod, preferably on the surface.

In a related embodiment the catalyst comprises a rigid porous structure including the carbide-based nanorods comprising oxycarbides which have been formed into extrudates connected into the rigid porous structure by gluing agents or in any other manner sufficient to form the rigid porous structure. Each catalytic compositions discussed immediately above can be used as a catalyst in a fluid phase reaction selected from the group consisting of hydrogenation, hydrodesulfurisation, hydrodenitrogenation, hydrodemetallisation, hydrodeoxygenation, hydrodearomatization, dehydrogenation, hydrogenolysis, isomerization, alkyation, dealkyation and transalkylation.

Another embodiment relates to a catalyst comprising a composition including a multiplicity of carbon nanotubes having substantially uniform diameters. In this embodiment the carbon nanotubes comprise carbide compounds anywhere on, in or within the nanotubes, but preferably on the surface of the nanotubes. In yet another related embodiment the carbon nanotubes additionally comprise oxycarbide compounds on, in or within the nanotubes, but preferably on the surface as more specifically described in section "Supported Carbides and Oxycarbides" of the of the specification. In these embodiments the nanotube morphology is substantially retained.

In a related embodiment the catalyst comprises a rigid porous structure including carbon nanotubes comprising carbide compounds and, in another embodiment, also oxycarbide compounds as described above. Each rigid porous structure is useful as a catalyst in a fluid phase reaction to catalyze a reaction selected from the group consisting of hydrogenation, hydrodesulfurisation, hydrodenitrogenation, hydrodemetallisation, hydrodeoxygenation, hydrodearomatization, dehydrogenation, hydrogenolysis, isomerization, alkyation, dealkyation and transalkylation.

In another embodiment the catalytic composition includes a multiplicity of carbon nanotubes having a carbide portion which has been converted to a carbide nanorod forming a nanotube-nanorod hybrid structure. In another related embodiment, the catalytic composition includes a multiplicity of carbon nanotubes having a carbide nanorod portion and in addition also an oxycarbide portion which has been converted to an oxycarbide nanorod. In yet other related embodiments the foregoing carbon nanotubes can be included in rigid porous structures, wherein the carbon nanotubes are formed into extrudates and/or are otherwise connected to form rigid porous structures. The catalytic compositions are useful as catalysts in a fluid phase reaction selected from the group consisting of hydrogenation, hydrodesulfurisation, hydrodenitrogenation, hydrodemetallisation, hydrodeoxygenation, hydrodearomatization, dehydrogenation, hydrogenolysis, isomerization, alkyation, dealkyation and transalkytion.

EXAMPLES

The invention is further described in the following examples. The examples are illustrative of some of the products and methods of making the same falling within the scope of the present invention. They are, of course, not to be considered in any way restrictive of the scope of the invention. Numerous changes and modification can be made with respect to the invention. The materials used in the examples hereinbelow are readily commercially available.

In all of the experiments which follow the source of carbon was provided by aggregates of carbon nanotubes as manufactured by Hyperion Catalysis International of Cambridge, Mass. The aggregates of carbon nanotubes were of the cotton candy ("CC") also known as combed yarn ("CY") type as described in the section entitled "Nanotube Aggregates and Assemblages" herein above.

Example 1

Preparation of Moybdenum Carbide Precursors by Impregnation of Carbon Nanotube Aggregates with Molybdenum Acetyl Acetonate Five grams of powder samples of CC aggregates having porosity of 6.5 cc/gm were impregnated by the incipient wetness with 35 cc of an ethanol solution containing the correct amount of $MoO_2(C_5H_7O_2)_2$ or molybdenum acetyl acetonate (herein referred to as Moacac) necessary for the desired C:Mo atom ratio loading. The resulting mixture was dried at 110° C. at full vacuum for 18 hours during which the Mo precursor decomposed to a mixture of molybdenum suboxides, generally designated as $MoO_{3-x}$, wherein x is 0 or 1. The sample was set aside for conversion to carbide catalysts by careful calcination under an inert atmosphere as described in Examples 5, 6 or 7 hereinbelow.

Example 2

Preparation of Moylbdenum Carbide Precursors by Impregnation of Carbon Nanotube Aggregates with Ammonium Moybdate A similar procedure as used in Example 1 above was followed, except that the impregnating solutions were aqueous solutions containing the correct amount of ammonium heptamolybdate tetrahydrate or $(NH_4)_6Mo_7O_{24} \cdot 4H_2O$ herein referred to as ammonium molybdate necessary for the desired C:Mo atom ratio loading. The resulting mixtures were dried at 225° C. in full vacuum for 18 hours during which the heptamolybdate compound was decomposed to $MoO_3$. The sample was set aside for conversion to carbide catalysts by careful calcination under an inert atmosphere as more particularly described in Examples 5, 6 and 7 herein.

Examples 3

Preparation of Molybdenum Carbide Extrudate Precursors by Impregnation with Molybdenum Acetyl Acetonate or Ammonium Molybdate CC or CY type aggregates were oxidized with nitric acid as described in U.S. application Ser. No. 08/352, 400 filed Dec. 8, 1994 entitled "Functionalized Nanotubes" to form oxidized CC aggregates having an acid titer of about 0.6 mg/g).

Five grams of the oxidized CC type aggregates of carbon nanotubes were well-mixed with either an ethanol solution of Moacac or an aqueous solution of ammonium heptamolybdate tetrahydrate, each solution containing the correct amount of Mo compound necessary for the desired C:Mo loading. The mixing was accomplished by kneading in a Braybender kneader until the paste had a homogeneous consistency. The excess solvent was removed from the kneaded sample by evaporation until a solids content of from about 8 to about 10% by weight was obtained. The material was then extruded by using an pneumatic gun extruder. The extrudates were about ⅛" diameter and several centimeters in length. The extrudates were then dried at 200° C. in air for 18 hours during which some shrinkage occurred. The dried extrudates were then broken into pieces of about ¹⁄₁₆ inch by ¼ inch which were set aside for conversion to carbide catalysts by careful calcination as described in examples 5, 6 and 7 herein.

Example 4

Preparation of Molybdenum Carbide Precursor by Mixing Carbon Nanotube Aggregates with Ammonium Molybdate or Molybdenum Oxide As grown CC or CY aggregates were oxidized with nitric acid as described in Example 3 to form oxidized CC aggregates having an acid titer of about 0.6 mg/g.

Five grams of oxidized CC type aggregates of carbon nanotubes were physically admixed with the correct amount of either ammonium heptamolybdate tetrahydrate or $MoO_3$ necessary for the desired C:Mo atom ratio by kneading the sample in a mortar and pestle. A small amount of wetting agent such as water or ethylene glycol, was added periodically to keep the oxidized carbon nanotube powder dusting under control and to facilitate the contact between the molybdenum precursor particles and the carbon nanotube aggregates. After the mix was kneaded to a homogeneous thick paste, the excess solvent was removed by gentle warming while continuing to knead the sample. The mixture was then dried at 200° C. for 14 hours in air and set aside for conversion to carbide be careful calcination as described in examples 5, 6 and 7 herein.

Example 5

Calcination of Molybdenum Carbide Precursors at 600° C. or 625° C.

Weighed samples of molybdenum carbide precursors were loaded into porcelain boats which were then placed horizontally in a 1 inch quartz tube. The tube and boat assembly were placed in a high temperature furnace equipped with a programmable temperature controller and a movable thermocouple. The thermocouple was located directly in contact with the end of the boat. The sample was heated under a slow flow, i.e., at several standard cc's/min of argon at a heating rate of 5° C./min to 200° C. and thereafter at 1° C./min to the final temperature of 600° C. at 625° C. The sample was held at this temperature for 18 hours. Since pure Mo2C reacts violently with atmospheric oxygen, after cooling in argon to ambient temperature, the samples were passivated by passing 3% $O_2$/Ar over them for 1 hour.

Example 6

Calcination of Molybdenum Carbide Carbon Precursors at 800° C.

The same procedure as described in Example 5 above was followed up to 600° C. The samples were then held at 600° C. for one hour. Thereafter, heating was resumed at the same rate of 1° C./min to 800° C. and held at that temperature for another 3 hours. After cooling in argon, the samples were passivated using 3% $O_2$/Ar.

Example 7

Calcination of Molybdenum Carbide Carbide Precursors at 1000° C.

The same procedure as described in Example 6 above was followed up to 800° C., at which temperature the samples were held for 1 hours. Thereafter, heating of the samples was resumed at the rate of 1° C./min to 1000° C., where the temperature was maintained for 0.5 hours. After cooling in argon, the samples were passivated using 3% $O_2$/Ar.

Results of Eamples 1–7

Unsupported carbide nanorods and carbide nanoparticles supported on carbon nanotubes were prepared according to Examples 1 to 7 above. Table 1 below summarizes the experimental conditons and XRD results for selected experiments.

TABLE 1

SUMMARY OF RESULTS FOR MOLYBDENUM CARBIDE PREPARATIONS
$2MoO_3 + 7 C \rightarrow Mo_2C + 6 CO$

| SAMPLE | METHOD | T° C. | C:Mo initial | Weight loss (theor) | PHASES, XRD |
|---|---|---|---|---|---|
| 1 | Moacac (s)[b] | 600 | 4 (94)[e] | 27 (44) | C, $MoO_2$, $Mo_2C$ (hex) |
| 2 | $MoO_3$ (s)[a] | 800 | 35 (38)[e] | 23 (35) | C, $Mo_2C$ (cub) |
| 3 | $MoO_3$ (s)[a] | 800 | 40 (34)[e] | na | C, $Mo_2C$ (hex) |
| 4 | Moacac (s)[b] | 800 | 10 (85)[e] | 31 (32) | C, $Mo_2C$ (hex) |
| 5 | Moacac (s)[b] | 800 | 20 (57)[e] | 27 (22) | $Mo_2C$ (hex/cub), Mo |
| 6 | $MoO_3$ (s)[b] | 1000 | 10 (85)[e] | 41 (32) | $Mo_2C$ (hex), Mo |
| 7 | $MoO_3$ (s)[b] | 1000 | 20 (57)[e] | 27 (22) | $Mo_2C$ (hex/cub), Mo |
| 8 | $MoO_3$ (s)[b] | 1000 | 10 (85)[e] | 38 (32) | C, $Mo_2C$ (hex) |
| 9 | $MoO_3$ (s)[b] | 625 | 30 (43)[e] | 20 (17) | C, $Mo_2C$ (hex/cub) |
| 10 | $MoO_3$ (s)[b] | 625 | 20 (57)[e] | 27 (22) | C, $Mo_2C$ (hex), $MoO_2$ |
| 11 | $MoO_3$ (s)[b] | 1000 | 50 (28)[e] | 12 (11) | C, $Mo_2C$ (hex/cub) |
| 12 | $MoO_3$ (s)[c] | 800 | 3.5 (100)[e] | 55 (55) | $Mo_2C$ (hex/cub) |

[a]Impregnated powder of aggregates of carbon nanotubes
[b]Impregnated extrudates of aggregates of carbon nanotubes
[c]Powder of aggregates of carbon nanotubes physically mixed with Mo precursor
[e]Calculated $Mo_2C$ loading in final calcined product assuming full conversion of Mo precursor to $Mo_2C$ The chemical reaction followed by all experiments summarized in Table 1 above is set forth at the top. In the method column, there is a listing of molybdenum precursors which were converted to $Mo_2C$ by reaction with carbon nanotubes. Moacac refers to molybdenyl acetylacetonate and $MoO_3$ refers to molybdenum trioxide. "(s)" refers to the solid phase of the molybdenum precursor. Superscripts a, b and c refer to methods of dispersing the reactants as described in examples 2, 3 and 4, respectively. T° C. refers to the final calcination temperature of the reaction temperature cycle. "C:Mo initial" refers to the atomic ratio of C:Mo in the original reaction mixture before conversion to a carbide compound. For example, the stoichiometric atom ratio to produce pure carbide with no excess C or Mo, i.e., pure $Mo_2C$ is 3.5. The number following in parentheses is the calculated loading of the $Mo_2C$ contained in the resulting materials. "Weight loss (theor)" refers to the theoretical weight loss according to the equation at the top of Table 1. "Phases, XRD" shows the compounds found in the X-ray diffraction (XRD) analyses. $Mo_2C$ exists in two distinct crystallographic phases, hexagonal and cubic.

Table 2 below summarizes the XRD results for the samples of Table 1.

TABLE 2

SUMMARY OF XRD RESULTS

| Sample | $Mo_2C$ (hex) | $Mo_2C$ (cubic) | $MoO_2$ |
|---|---|---|---|
| MoC | >100 nm | | |
| 1 | 15~20 nm | | Minor Component |
| 2 | | 5~8 nm | |
| 3 | | 5~8 nm | |
| 4 | 10~15 nm | | |
| 5 | 15~20 nm | ~15 nm | |
| 6 | 20 nm | | |
| 7 | 36~38 nm | | |
| 8 | 8~10 nm | 8~10 nm | |
| 9 | 18 nm | | Minor Component |
| 10 | 20~25 nm | 5~8 nm | |
| 11 | 35 nm | | |
| 12 | 26 nm | | |

Table 2 summarizes the XRD results for the experiments summarized in Table 1, identifies the compounds made, the phases present, and the calculated average particle size for the different phases.

The average particle size is a volume-biased average size, such that the value of one large particle counts more heavily than several medium particles and much more than the volume of many small particles. This is a conventional procedure which is well known to those familiar with XRD methods.

Discussion of Results of Examples 1–7

A. Unsupported $Mo_2C$ Nanoparticles and Nanorods

Samples 1 and 12 provided the clearest evidence of the formation of free-standing $Mo_2C$ nanorods and nanoparticles. These were obtained by reacting stoichiometric or near stoichiometrix mixtures of $MoO_3$ and carbon nanotubes, either as powder or as extrudates. Product identification and morphologies were obtained by SEM, HRTEM and XRD. In Example 1, with about 15% excess of C, the major product was identified by XRD as the hexagonal phase of $Mo_2C$. $MoO_2$ and graphitic carbon were seen as minor components. SEM showed the presence of both nanorods (~10–15 nm diameter) and nanoparticles (~20 nm).

Samples 11 and 12 resulted by reacting carbon nanotubes either with a stoichiometric mixture of well-dispersed $MoO_3$ powder, or with impregnated ammonium molybdate.

More evidence of the formation of $Mo_2C$ nanorods and nanoparticles was obtained in Sample 12, which resulted by reacting of a stoichiometric mixture of $MoO_3$ and powder of carbon nanotubes. XRD, SEM and HRTEM analyses showed formation of both $Mo_2C$ nanorods and nanoparticles. The SEM analyses showed a network of nanorods with nanoparticles distributed within the network as shown in FIG. 1. Accurate dimensions of carbide nanorods have been obtained by HRTEM as shown in FIG. 2, which shows carbide nanorods having diameters similar to those of carbon nanotubes, namely, about 7 nm. The carbide nanoparticles particles ranged from about 7 to about 25 nm in diameter.

Sample 12, which was a stoichiometric mixture, was studied in more detail in order to learn the course of the reaction. The reaction was tracked by thermogravimetric analysis (TGA) as shown in FIG. 4. FIG. 4 shows that the stoichiometric reaction has occurred in two distinct steps, namely, reduction of $MoO_3$ by carbon to $MoO_2$ at from about 450 to about 550° C., followed by further reduction to $Mo_2C$ at from about 675° C. to about 725° C. SEM and XRD analyses taken after calcination at 600° C. showed a complete redistribution of oxide precursor from the very large, supra-$\mu$ particles of $MoO_3$ initially present to about 20–50 nm particles of $MoO_{3-x}$, well-dispersed amongst individual fibrils. This redistribution probably occurred through vaporization. Further calcination to 800° C. converted the $MoO_{3-x}$ (wherein x is 0 or 1) mixture to $Mo_2C$ nanorods and nanoparticles, with further reduction in particle size from about 7 to about 25 nm. Even though redistribution of $MoO_3$ probably takes place through vaporization, both chemical transformations ($MoO_3 \rightarrow MoO_2$ and $MoO_2 \rightarrow Mo_2C$ by reduction by carbon) are believed to occur through solid-solid phase reactions.

B. $Mo_2C$ Nanoparticles Supported on Carbon Nanotubes

XRD, SEM and HRTEM analyses of products from Sample 10 provided evidence for the successful preparation of nanoparticles of $Mo_2C$ supported on individual carbon nanotubes. These products were formed by impregnation of ammonium molybdate from aqueous solution onto CC aggregates of carbon nanotubes and carefully calcined as shown in Table 1. XRD's of both products showed the cubic form of $Mo_2C$ to be the major component along with graphitic carbon. Hexagonal $Mo_2C$ was seen as a minor component. No molybdenum oxide was detected. The cubic $Mo_2C$ particles ranged from about 2 to about 5 nm in diameter, while the hexagonal particles ranged from about 10 to about 25 nm. The cubic particles were mainly deposited on individual carbon nanotubes, while the hexagonal particles were distributed between carbon nanotubes. These can be seen in FIGS. 3 and 4, which are copies of HRTEM micrographs taken from Sample 10. In these pictures, the particle size can be estimated by direct comaprison with the fibril diameters, which range from 7–10 nm.

Example 8

Preparation of Tungsten Carbide Precursors by Impregnation with Ammonium Tungstate The same procedure as used in Example 2 above was followed, except that the impregnating solution was an aqueous solution containing the correct amount of ammonium paratungstate hydrate or $(NH_4)_{10}W_{12}O_{41} \cdot 5H_2O$, 72% W (herein referred to as ammonium tungstate) necessary for the desired C:W atom ratio loading (C:W mole ratios of 3.5:1, 10:1 and 20:1.) The resulting mixture was dried at 225° C. in full vacuum for 18 hours during which the paratungstate compound was decomposed to $WO_3$. The sample was set aside for conversion to carbide catalysts by careful calcination under an inert atmosphere as more particularly described in Example 10 herein.

Example 9

Preparation of Tungsten Carbide Precursors by Impregnation with Phosphotungstic Acid (PTA)

The same procedure as used in Example 8 above was followed, except that the impregnating solution was an aqueous solution containing the correct amount of phosphotungstic acid, $H_3PO_4 \cdot 12WO_3 \cdot xH_2O$, 76.6% W, herein referred to as PTA, necessary for the desired C:W atom ratio loading (C:W mole ratios of 3.5:1, 10:1 and 20:1.) The resulting mixture was dried at 225° C. in full vacuum for 18 hours during which the PTA was decomposed to $WO_3$. The sample was set aside for conversion to carbide catalysts by careful calcination under an inert atmosphere as more particularly described in Example 10 herein.

Example 10

Calcination of Tungsten Carbide Precursors at 1000° C.

The same procedure as described in Example 7 above was followed to vonvert precursors of tungsten carbides to tungsten carbides. After cooling in argon, the samples were passivated using 3% $O_2$/Ar. Table 3 below summarizes the experimental conditions and XRD results for selected experiments.

TABLE 3

SUMMARY OF RESULTS FOR TUNGSTEN CARBIDE PREPARATIONS
$WO_3(s) + 4C \rightarrow WC + 3 CO$
$2WO_3(s) + 7C \rightarrow W_2C + 6 CO$

| SAMPLE | COMPONENTS | T° C. | C:W INITIAL | PHASES, XRD |
|---|---|---|---|---|
| 1 | PTA and CC[a] | 1000 | 3.5:1 | WC and $W_2C$ |
| 2 | PTA and CC | 1000 | 10:1 | WC and $W_2C$ |
| 3 | PTA and CC | 1000 | 20:1 | WC and $W_2C$ |
| 4 | A. Tung and CC[b] | 1000 | 3.5:1 | WC, $W_2C$ and possibly W |
| 5 | A. Tung and CC | 1000 | 10:1 | WC and $W_2C$ |
| 6 | A. Tung and CC | 1000 | 20:1 | WC and $W_2C$ |

[a]Impregnated powder of CC aggregates of carbon nanotubes by incipient wetness with phosphotungstic acid
[b]Impregnated powder of CC aggregates of carbon nanotubes by incipient wetness with ammonium paratungstate hydrate The chemical reactions occurring in these experiments are summarized in Table 3 above. In the components column, there is a listing of molybdenum precursors which were converted to $W_2C$/WC by reacting with carbon nanotubes. PTA refers to phosphotungstic acid and A. Tung refers to ammonium paratungstate hydrate. "(s)" refers to solid phase of the tungsten precursor. C:W refers to the ratio of C atoms to W atoms in the original mix. The stoichiometric atom ratio to produce pure WC with no excess of C or W is 4.0. To produce pure $W_2C$, the atom ratio C:W is 3.5. The XRD column lists the compounds observed in the X-ray diffraction (XRD) analyses.

Examples 11–13

Preparation of a Catalyst Support of Extrudates of Silicon Carbide Nanorods

SiC nanorods were prepared from Hyperion aggregates of carbon nanotubes in accordance with Example 1 of U.S. application Ser. No. 08/414,369 filed Mar. 31, 1995 by reacting the carbon nanotubes with SiO vapor at high temperature. The resulting SiC nanorods have a uniform diameter of 15 nm on the average and a highly crystallized βSiC structure.

Poly(dimethylsiloxane) as provided by Aldrich Chemicals, Milwaukee, Wis., was used as a binder for the preparation of extrudates of SiC nanorods. 0.16 g of SiC nanorods and 0.16 g of poly(dimethylsiloxane) were mixed to form a uniform thick paste. Subsequently, the paste was pushed through a syringe to produce extrudates of a green color which were heated under flowing argon atmosphere as follows: at 200° C. for 2 hours (Example 11); at 400° C. for 4 hours (Example 12), and at 700° C. for 4 hours (Example 13). A rigid porous structure of SiC nanorods has formed.

Figure 5B:
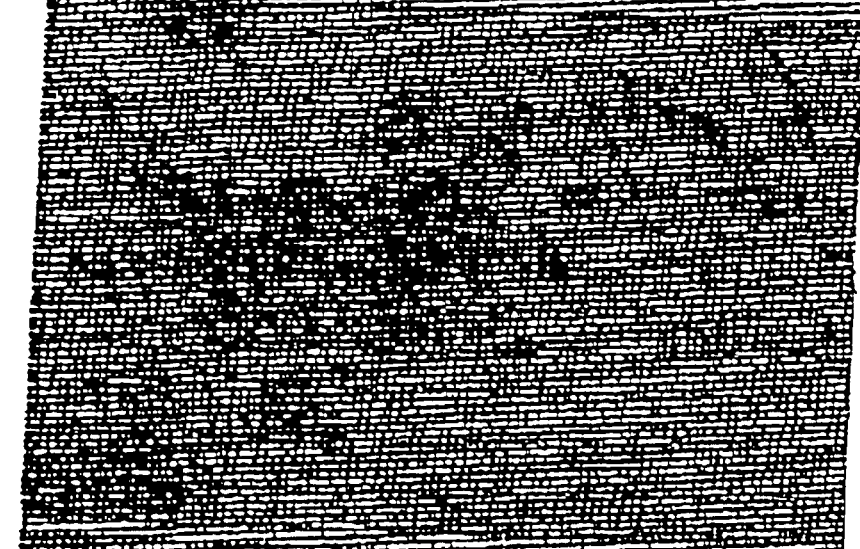
FIG. 5B is an SEM micrograph illustrating micropores among the aggregates of the extrudates shown in FIG. 5A.
Figure 5C:
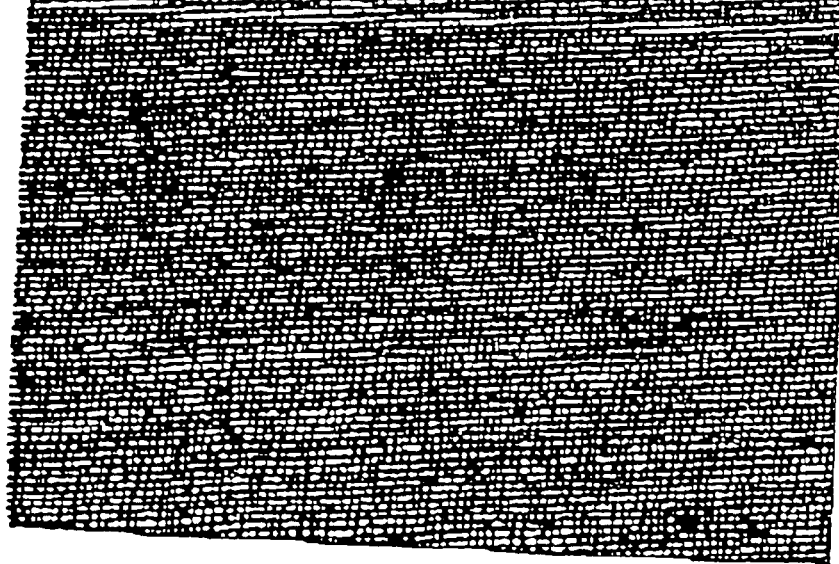
FIG. 5C is an SEM micrograph illustrating micropores in the networks of the intertwined SiC nanorods present in the extrudates shown in FIG. 5A.

The extrudates obtained in Example 11–13 had a density of 0.97 g/cc and a bimodal pore structure. The macropores were 1–5 μm, as shown in FIG. 5B among aggregates and the mesopores were 10–50 nm, as shown in FIG. 5C in the networks of intertwined SiC nanorods. The diameter of the extrudates was around 1.2 mm as shown in FIG. 5A. The specific surface area of the extrudates of SiC nanorods was 97 $m^2$/g.

Because of high surface area, unique pore structure and high temperature stability, the SiC extrudates are attractive for various applications, including support for catalysts such as platinum, palladium and the like and carbides of Mo, W, V, Nb or Ta. The surface properties of SiC nanorods when used as a catalyst support are very close to that of carbon. Therefore conventional carbon supports can be replaced with SiC extrudates and thus extend many properties of carbon supported catalysts to high temperature regions, as required in particular for oxidative conditions.

Examples 14 and 15

Preparation by Reductive Carburization of Extrudates of Carbon Nanotubes Including Molybdenum Carbides Two samples of 5 grams of extrudates of carbon nanotubes bearing a volatile molybdenum compound prepared according to Example 14 above are charged into alumina boats. Each boat is placed into a tube furnace and is heated under flowing argon for two hours at 250° C. and 450° C., respectively. The gas is changed from argon to a mixture of $CH_4$/$H_2$ (20% $CH_4$) and the furnace is slowly (1° C./min) heated up to 650° C. where the temperature is maintained for 1 hour. Molybdenum carbides supported on the surface of extrudates of carbon nanotubes are obtained.

Example 16

Preparation by Reactive Chemical Transport of Extrudate of Molybdenum Carbide Nanorods 1 gram of extrudates of carbon nanotubes, 8 grams of molybdenum powder and 50 mg of bromine contained in a glass capsule are placed into a quartz tube which is evacuated at $10^{-3}$ torr and then sealed. After the bromine capsule is broken, the tube is placed into a tube furnace and heated at 1000° C. for about one week. The extrudates of carbon nanotubes have been substantially converted to molybdenum carbide nanorods.

Example 17

Preparation by Carburization of Molybdenum Carbides Supported on the Surface of Extrudates of Carbon Nanotubes A sample of extrudates of carbon nanotubes is placed in a vertical reactor such that a bed is formed The extrudates are heated under flowing $H_2$ gas at 150° C. for 2 hours. Thereafter, the extrudates are cooled to 50° C. $H_2$ gas passed through a saturator containing $Mo(CO)_6$ at 50° C. is flown over the cooled extrudates of carbon nanotubes. As a result, Mo(CO)$_6$ becomes adsorbed on the surface of extrudates of carbon nanotubes. Following the adsorption of Mo(CO)$_6$ step, the temperature of the sample is raised to 150° C. in an atmosphere of pure H$_2$. The temperature is maintained at 150° C. for 1 hour. The temperature of the sample is then increased at 650° C. and maintained at this temperature for 2 hours under flowing H$_2$ gas. A sample of extrudates of carbon nanotubes bearing molybdenum on their surfaces is obtained. This sample is then kept at 650° C. for 1 hour and the gas is switched from H$_2$ to a CH$_4$/H$_2$ mixture (20% CH$_4$). The molybdenum adsorbed on the surfaces of carbon nanotubes is converted to molybdenum carbides. By varying the duration of adsorption of the Mo(CO)$_6$ over the cooled carbon nanotube extrudates, the amount of molybdenum carbide formed on the surface of the extrudate can be controlled.

The terms and expressions which have been employed are used as terms of description and not of limitations, and there is no intention in the use of such terms or expressions of excluding any equivalents of the features shown and described as portions thereof, it being recognized that various modifications are possible within the scope of the invention.

Thus, while there had been described what are presently believed to be the preferred embodiments of the present invention, those skilled in the art will appreciate that other and further modifications can be made without departing from the true scope of the invention, and it is intended to include all such modifications and changes as come within the scope of the claims as appended herein.

We claim:

1. A method of making a composition including oxycarbide-based nanorods having diameters between 1.0 nm and 100 nm which comprises subjecting carbide-based nanorods to treatment with an oxidizing agent under conditions sufficient to cause the formation of oxycarbides.

2. The method of claim 1, wherein said oxidizing agent is a gas selected from the group consisting of air, oxygen, carbon dioxide, nitric oxide, nitrous oxide, nitrogen dioxide, water vapor and mixtures thereof.

3. The method of claim 2, wherein said gas is admixed with a inert diluent selected from inert gases or nitrogen.

4. The method of claim 1, wherein said oxycarbides are in an amount from about 0.5% to about 25%.

5. The method of claim 1, wherein said conditions are sufficient to convert said carbide-based nanorods into oxycarbide-based nanorods in an amount from about 0.5% to about 25% by weight.

6. The method of claim 1, wherein said conditions are sufficient to cause the formation of oxycarbides predominately on the surface of said carbide-based nanorods.

7. The method of claim 1, wherein said carbide-based nanorods are prepared by a method comprising contacting carbon nanotubes with a Q-based compound under conditions sufficient to form carbide nanorods, wherein Q is selected from the group consisting of transition metals, rare earths and actinides.

8. The method of claim 7, wherein said carbon nanotubes are in the form of aggregates.

9. The method of claim 7, wherein said conditions are sufficient to convert said carbon nanotubes into carbide nanorods in amount from about 20% to 100% by weight.

10. The method of claim 7, wherein Q is selected from the group consisting of B, Ti, Ta, Nb, Zr, Hf, Si, Al, Mo, V, or W.

11. A method of making a rigid porous structure including carbide-based nanorods which comprises: (i) providing a rigid porous structure of carbon nanotubes; and (ii) contacting said rigid porous structure of carbon nanotubes with a Q-based compound under conditions sufficient to form carbide nanorods, wherein Q is selected from the group consisting of transition metals, rare earths and actinides.

12. The method of claim 11, wherein said carbide-based nanorods are in an amount from about 40% to about 100% by weight.

13. The method of claim 11, wherein said carbide-based nanorods are predominately on the surface of said carbon nanotubes.

14. The method of claim 11, wherein Q is selected from the group consisting of B, Ti, Ta, Nb, Zr, Hf, Si, Al, Mo, V, or W.

15. A method of making a rigid porous structure including carbide-based nanorods which comprises: (i) forming a suspension of carbide nanorods in a medium containing gluing agents; (ii) separating said medium from said suspension of carbide nanorods; and (iii) pyrolyzing said suspension to form said rigid porous structure including carbide nanorods.

16. A method of making a rigid porous structure including oxycarbide nanorods which comprises treating said rigid porous structure including carbide nanorods of claim 11 or 15 with an oxidizing agent selected from the group consisting of air, oxygen, carbon dioxide, nitric oxide, nitrous oxide, nitrogen dioxide, water vapor and mixtures thereof.

17. A method of making carbon nanotubes including carbides which comprises contacting carbon nanotubes with a Q-based compound under conditions sufficient to form carbides on the surface of said carbon nanotubes, wherein Q is selected from the group consisting of transition metals, rare earths and actinides.

18. The method of claim 17, wherein said conditions including a temperature from about 400° C. to about 1000° C.

19. The method of claim 17, further comprising subjecting said carbon nanotubes including carbides to treatment with an oxidizing agent thereby forming carbon nanotubes including carbides and oxycarbides.

20. The method of claim 19 said wherein said oxidizing agent is selected from the group consisting of air, oxygen, carbon dioxide, nitric oxide, nitrous oxide, nitrogen dioxide, water and mixtures thereof.

21. The method of claim 19, wherein said carbides and oxycarbides are on the surface of said carbon nanotubes.

22. A method of making a rigid porous structure having carbon nanotubes including carbides and oxycarbides which comprises: (i) forming a suspension of the carbon nanotubes of claim 19 in a medium; (ii) separating said medium from said suspension; and (iii) pyrolyzing said suspension to form said rigid porous structure comprising carbon nanotubes including carbides and oxycarbides.

23. The method of claim 17, wherein Q is selected from the group consisting of B, Ti, Ta, Nb, Zr, Hf, Si, Al, Mo, V, or W.

24. A method of making a rigid porous structure having carbon nanotubes including carbides which comprises: (i) forming a suspension from the carbon nanotubes of claim 17 in a medium; (ii) separating said medium from said suspension; and (iii) pyrolyzing said suspension to form said rigid porous structure comprising carbon nanotubes including carbides.

25. A method of making a composition including carbide-based nanorods having oxycarbides which comprises contacting carbide-based nanorods with an oxidizing agent under conditions sufficient to form oxycarbides in an amount from about 0.5% to about 25% by weight.

26. A method of making a rigid porous structure including extrudates of carbide nanorods which comprises: (i) providing a rigid porous structure including extrudates of carbon nanotubes; (ii) contacting said rigid porous structure of extrudates of carbon nanotubes with a Q-based compound under conditions sufficient to convert said carbon nanotubes into carbide nanorods, wherein Q is selected from the group consisting of transition metals, rare earths and actinides.

27. The method of claim 26, wherein Q is selected from the group consisting of B, Ti, Ta, Nb, Zr, Hf, Si, Al, Mo, V, or W.

28. A method of making a rigid porous structure comprising extrudates including carbide nanorods which comprises: (i) forming a paste from carbide-based nanorods; (ii) forming extrudates from said paste; and (iii) pyrolyzing said extrudates to form a rigid porous structure including carbide-based nanorods.

29. A method of making a rigid porous structure comprising extrudates including carbide nanorods having oxycarbides which comprises treating said extrudates including carbide nanorods of claim 26 or 28 with an oxidizing agent is selected from the group consisting of air, oxygen, carbon dioxide, nitric oxide, nitrous oxide, nitrogen dioxide, water and mixtures thereof.

* * * * *